US008987829B2

(12) United States Patent
Shimooka et al.

(10) Patent No.: US 8,987,829 B2
(45) Date of Patent: Mar. 24, 2015

(54) SEMICONDUCTOR DEVICE

(75) Inventors: Yoshiaki Shimooka, Tokyo (JP);
Takashi Izumida, Kanagawa-ken (JP);
Hiroki Okamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1767 days.

(21) Appl. No.: 12/100,621

(22) Filed: Apr. 10, 2008

(65) Prior Publication Data

US 2008/0251854 A1   Oct. 16, 2008

(30) Foreign Application Priority Data

Apr. 10, 2007   (JP) .................................. 2007-102455

(51) Int. Cl.
*H01L 27/092*   (2006.01)
*H01L 21/8238*   (2006.01)
*H01L 29/78*   (2006.01)

(52) U.S. Cl.
CPC ...... *H01L 21/823807* (2013.01); *H01L 27/092* (2013.01); *H01L 29/7843* (2013.01); *H01L 29/7846* (2013.01)
USPC ................... 257/374; 257/315; 257/E21.293; 257/E21.347; 257/506; 257/200

(58) Field of Classification Search
USPC .......... 257/374, 315, E21.293, E21.347, 506, 257/200
See application file for complete search history.

(56) References Cited

U.S. PATENT DOCUMENTS

| 6,924,543 | B2 | 8/2005 | Tolchinsky et al. |
| 2004/0113174 | A1 | 6/2004 | Chidambarrao et al. |
| 2004/0232513 | A1 | 11/2004 | Chi et al. |
| 2005/0233540 | A1 | 10/2005 | Yoon et al. |
| 2007/0082439 | A1* | 4/2007 | Park et al. ..................... 438/231 |
| 2010/0019317 | A1* | 1/2010 | Moroz et al. .................. 257/335 |

* cited by examiner

*Primary Examiner* — Cathy N Lam
(74) *Attorney, Agent, or Firm* — Oblon, McClelland, Maier & Neustadt, L.L.P.

(57) ABSTRACT

A semiconductor device may include a p-channel semiconductor active region and an n-channel semiconductor active region. An element isolation insulating layer electrically isolates the p-channel semiconductor active region from the n-channel semiconductor active region. An insulating layer made of a different material, being in contact with both ends, in its channel length direction, of the p-channel semiconductor active region applies a compression stress in the channel length direction to a channel of the p-channel semiconductor active region. The p-channel semiconductor active region is surrounded by the insulating layer, in the channel length direction, of the p-channel semiconductor active region and by the element isolation insulating layer, parallel to the channel length direction, of the p-channel semiconductor active region. The n-channel semiconductor active region is surrounded by the element isolation insulating layer.

11 Claims, 36 Drawing Sheets

Channel length direction

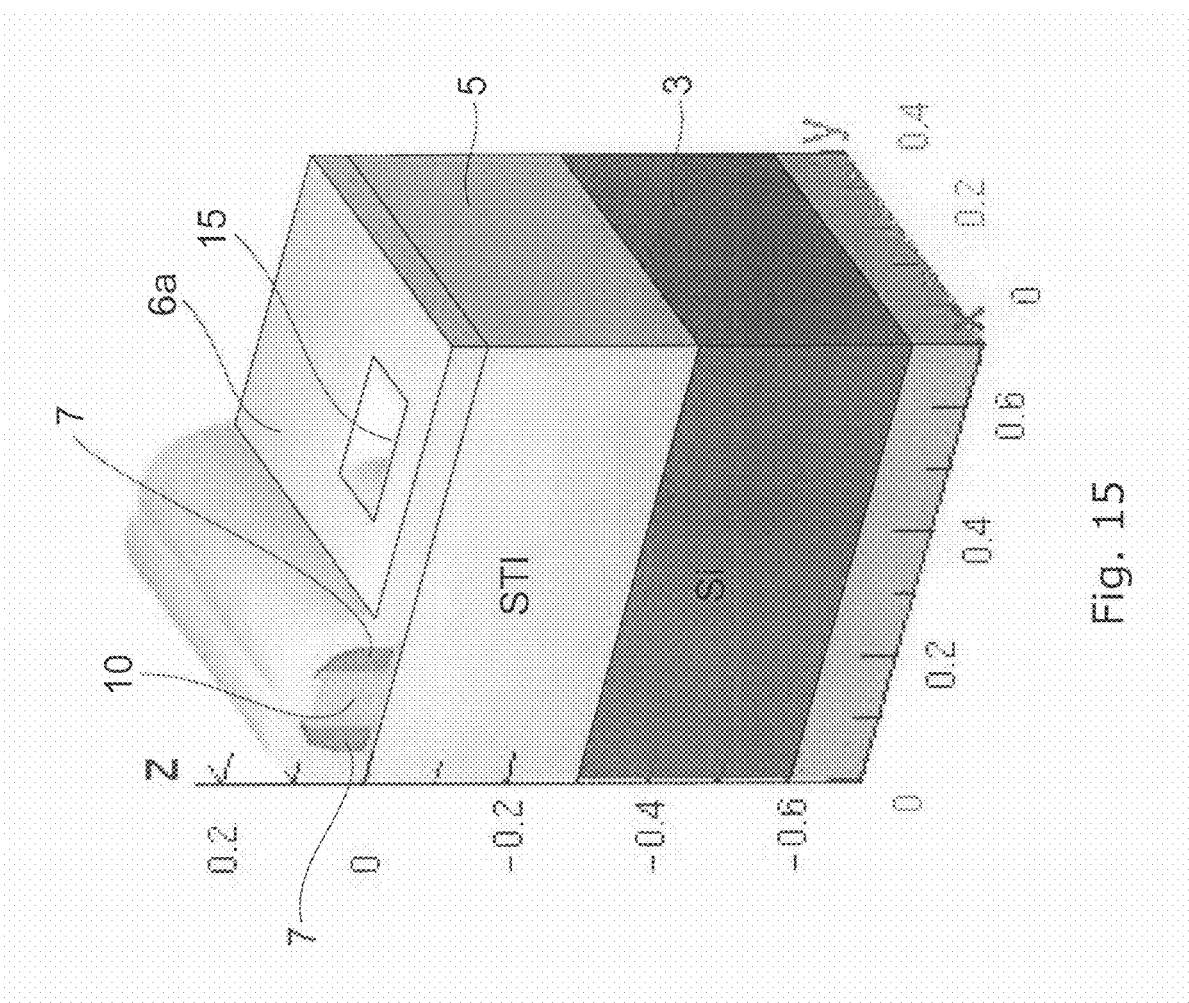

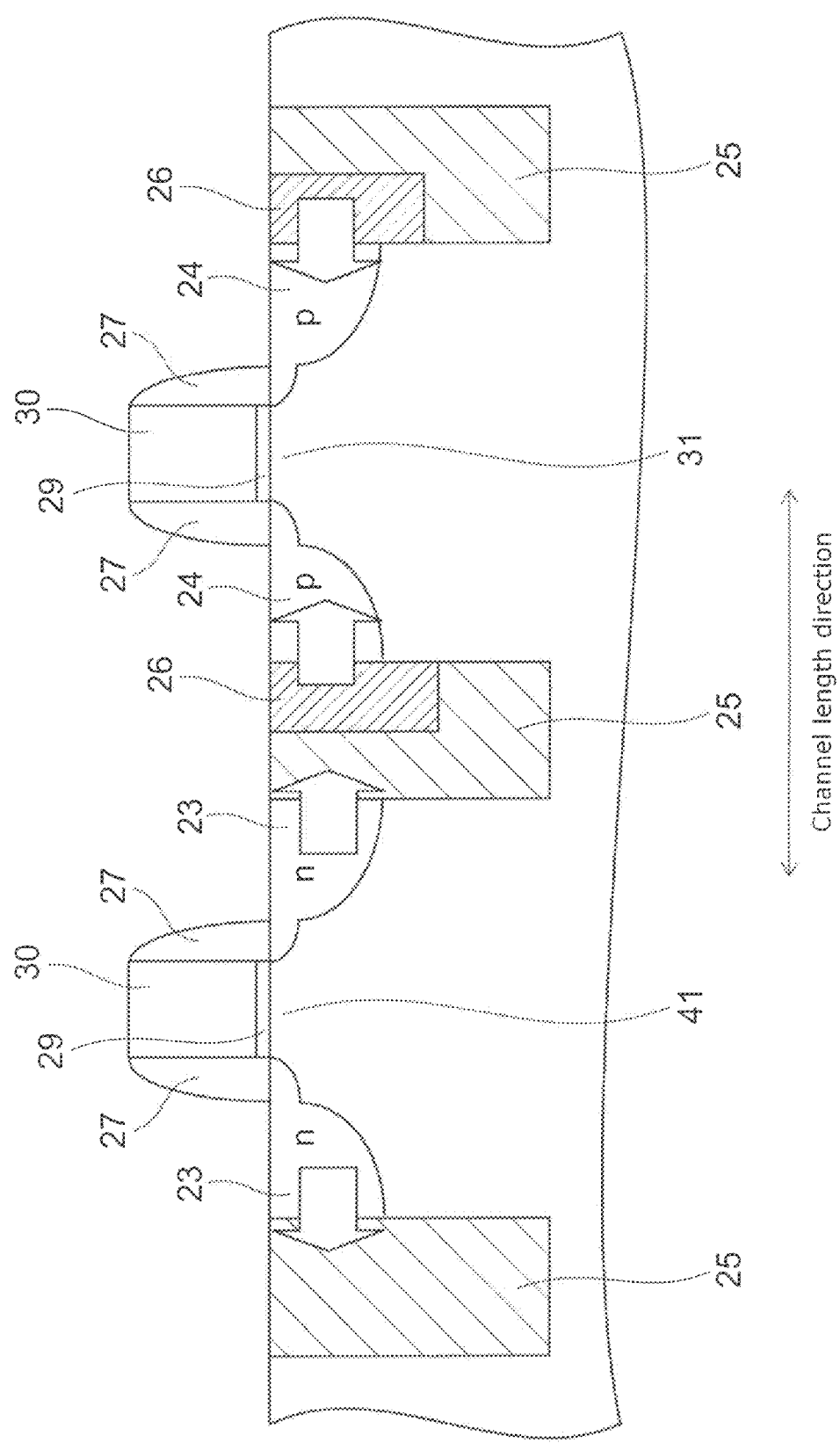

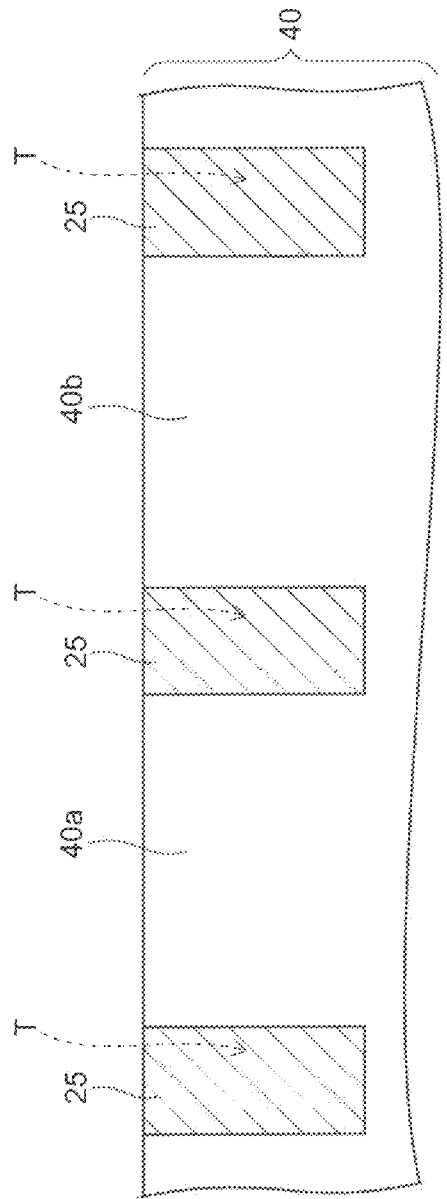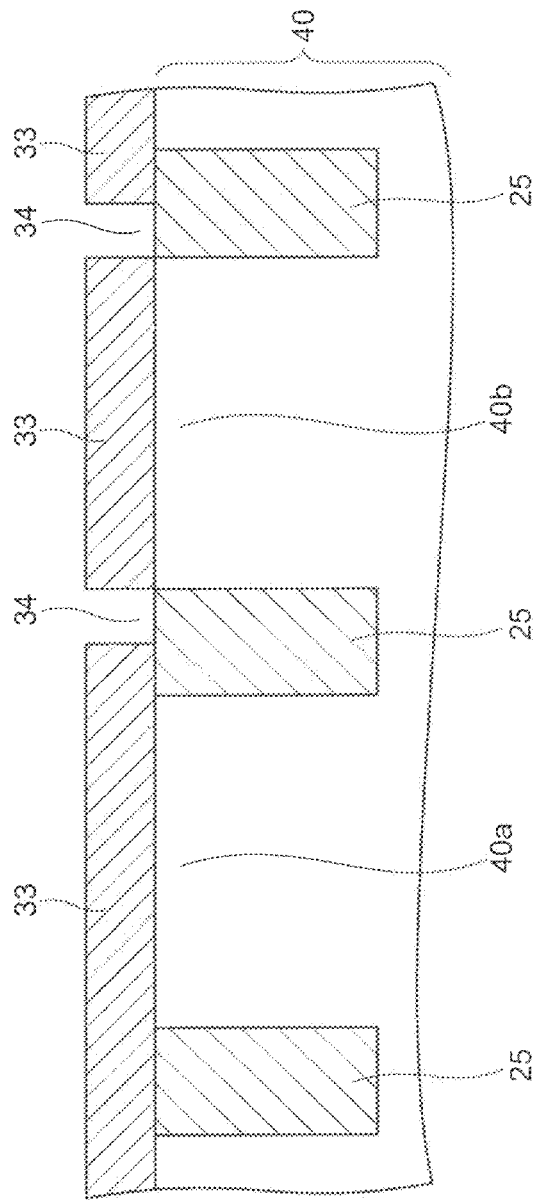
Fig. 21A
Fig. 21B

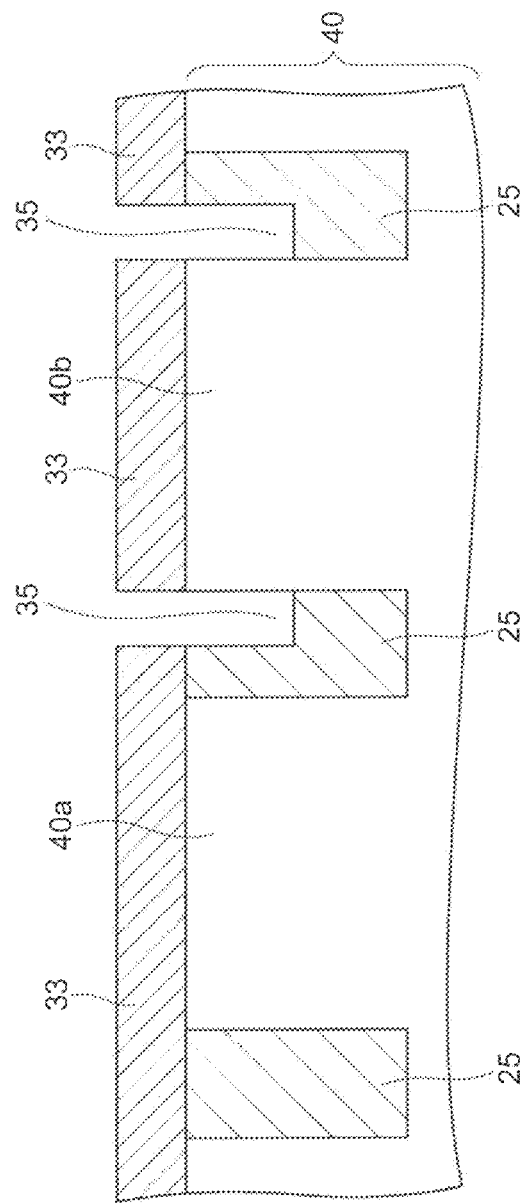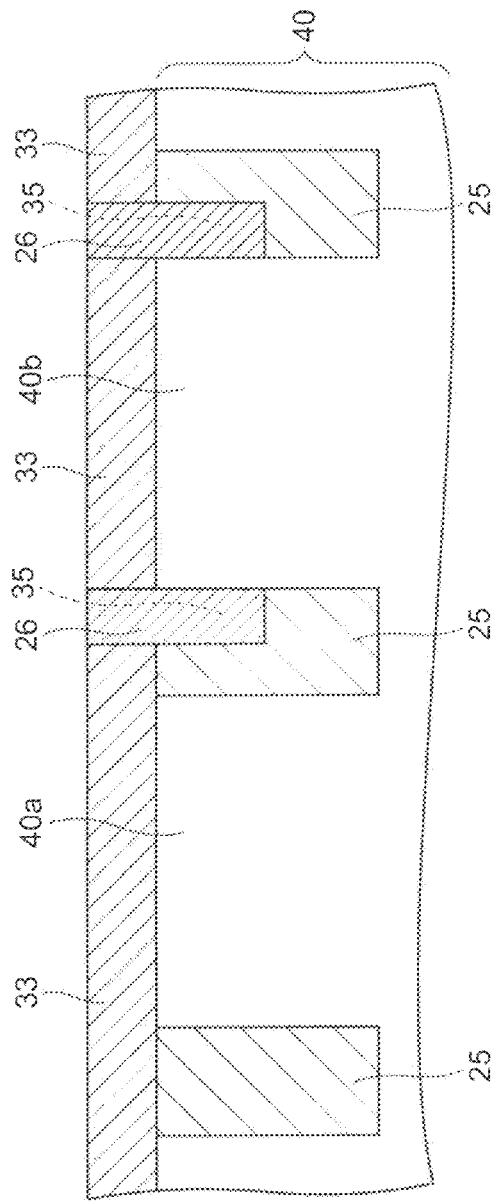
Fig. 22A
Fig. 22B

SEMICONDUCTOR DEVICE

CROSS REFERENCE TO RELATED APPLICATION

This application is based upon and claims the benefit of priority from Japanese Patent Application No. 2007-102455, filed on Apr. 10, 2007, the entire contents of which are incorporated herein by reference.

BACKGROUND

In recent years, with the increasing demand for a higher-performance transistor, it has been difficult to sufficiently improve the performance of a transistor only by miniaturizing the transistor. For this reason, new techniques are being employed. In one of such new techniques, the performance of a transistor is improved by applying a stress to its channel to increase the career (electron or hole) mobility.

For example, U.S. Pat. No. 7,081,395 discloses a technique in which an insulating layer provided so as to surround an NMOS active region and a PMOS active region and to isolate these regions from each other so that a stress of the insulating layer can be applied to the regions.

In general, in an NMOS active region, the increase in the career (electron) mobility is obtained when a tensile stress is isotropically applied. By contrast, in a PMOS active region, the increase in the career (hole) mobility is obtained when a compression stress is anisotropically applied in only the channel length direction (direction in which current flows). In the structure according to U.S. Pat. No. 7,081,395, an insulating layer for applying a compression stress in the channel length direction to the PMOS active region is provided at ends, in the channel width direction (direction approximately perpendicular to the channel length direction), of the NMOS active region. As a result, the compression stress of the insulating layer is also applied in the NMOS active region, so that the career mobility in the NMOS active region may possibly be reduced.

SUMMARY

Aspects of the invention relate to an improved semiconductor device.

In one aspect of the present invention, semiconductor device, may include a p-channel semiconductor active region having a p-type source region and a p-type drain region, an n-channel semiconductor active region having an n-type source region and an n-type drain region, an element isolation insulating layer which electrically isolates the p-channel semiconductor active region from the n-channel semiconductor active region, and an insulating layer made of a material different from that of the element isolation insulating layer, and being in contact with both ends, in its channel length direction, of the p-channel semiconductor active region to apply a compression stress in the channel length direction to a channel of the p-channel semiconductor active region, wherein the p-channel semiconductor active region is surrounded by the insulating layer, which is in contact with the both ends, in the channel length direction, of the p-channel semiconductor active region, and the p-channel semiconductor active region is surrounded by the element isolation insulating layer, which is in contact with the side surfaces, approximately parallel to the channel length direction, of the p-channel semiconductor active region, and the n-channel semiconductor active region is surrounded by the element isolation insulating layer.

In another aspect of the invention, a semiconductor device, may include a p-channel semiconductor active region having a p-type source region and a p-type drain region, an n-channel semiconductor active region having an n-type source region and an n-type drain region, an element isolation insulating layer which surrounds the p-channel semiconductor active region and the n-channel semiconductor active region so as to electrically isolate the p-channel semiconductor active region from the n-channel semiconductor active region, a first stress liner provided so as to cover surfaces of the p-channel semiconductor active region, and having an isotropic compression stress, and a second stress liner provided so as to cover surfaces of the n-channel semiconductor active region, and having an isotropic tensile stress, wherein the element isolation insulating layer has recessed portions in portions respectively in contact with both ends, in the channel length direction, of the p-channel semiconductor active region to have a level lower than the top surface of the p-channel semiconductor active region, and the first stress liner is provided so as to cover steps formed between the top surfaces of the recessed portions and the p-channel semiconductor active region.

In another aspect of the invention, a semiconductor device, may include a p-channel semiconductor active region having a p-type source region and a p-type drain region, an n-channel semiconductor active region having an n-type source region and an n-type drain region, an element isolation insulating layer which surrounds the p-channel semiconductor active region and the n-channel semiconductor active region so as to electrically isolate the p-channel semiconductor active region from the n-channel semiconductor active region, wherein a portion, surrounding the n-channel semiconductor active region, of the element isolation insulating layer has an isotropic tensile stress, while different portions of the element isolation insulating layer have either substantially no stress or a compression stress, the different portions being in contact with both ends, in the channel length direction, of the p-channel semiconductor active region, due to ultraviolet light irradiation selectively performed on the element isolation insulating layer.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIG. 15 is a diagrammatic perspective view of the main portion of the semiconductor device.

FIG. 20 is a cross-sectional view taken along line G-G in FIG. 19.

FIGS. 21 to 23 are process cross-sectional views for illustrating an example of a method of forming the insulating layers 26.

DETAILED DESCRIPTION

Figure 1:
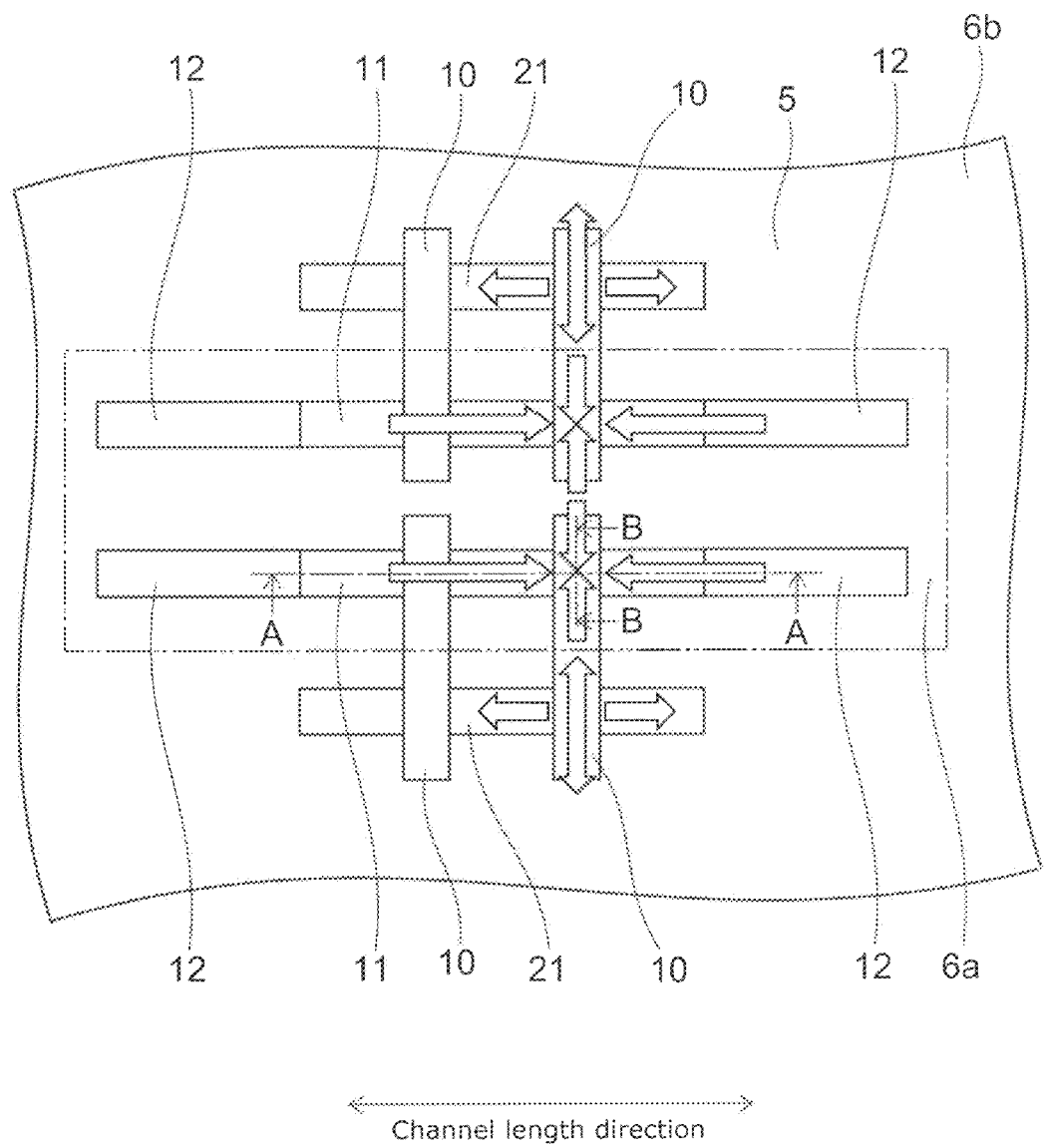
FIG. 1 is a cross sectional view of a semiconductor device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

FIG. 1 is a schematic view showing a planar layout of the main portion of a semiconductor device according to a first embodiment.

Figure 2A:
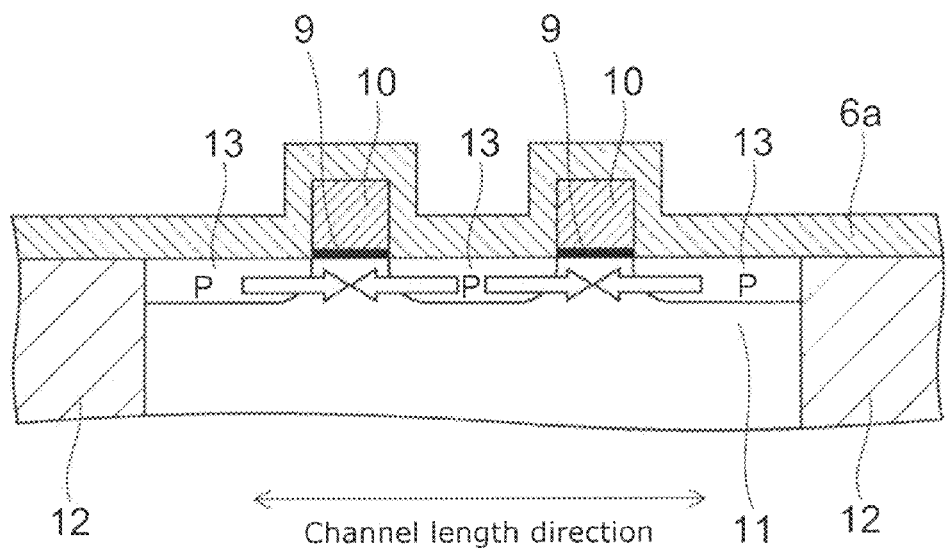
FIG. 2A is a cross-sectional view taken along line A-A in FIG. 1.
Figure 2B:
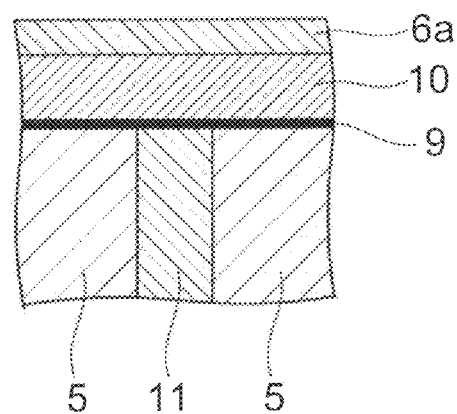
FIG. 2B is a cross-sectional view taken along line B-B in FIG. 1.

FIG. 2A is a cross-sectional view taken along line A-A in FIG. 1. FIG. 2B is a cross-sectional view taken along line B-B in FIG. 1.

Figure 3:
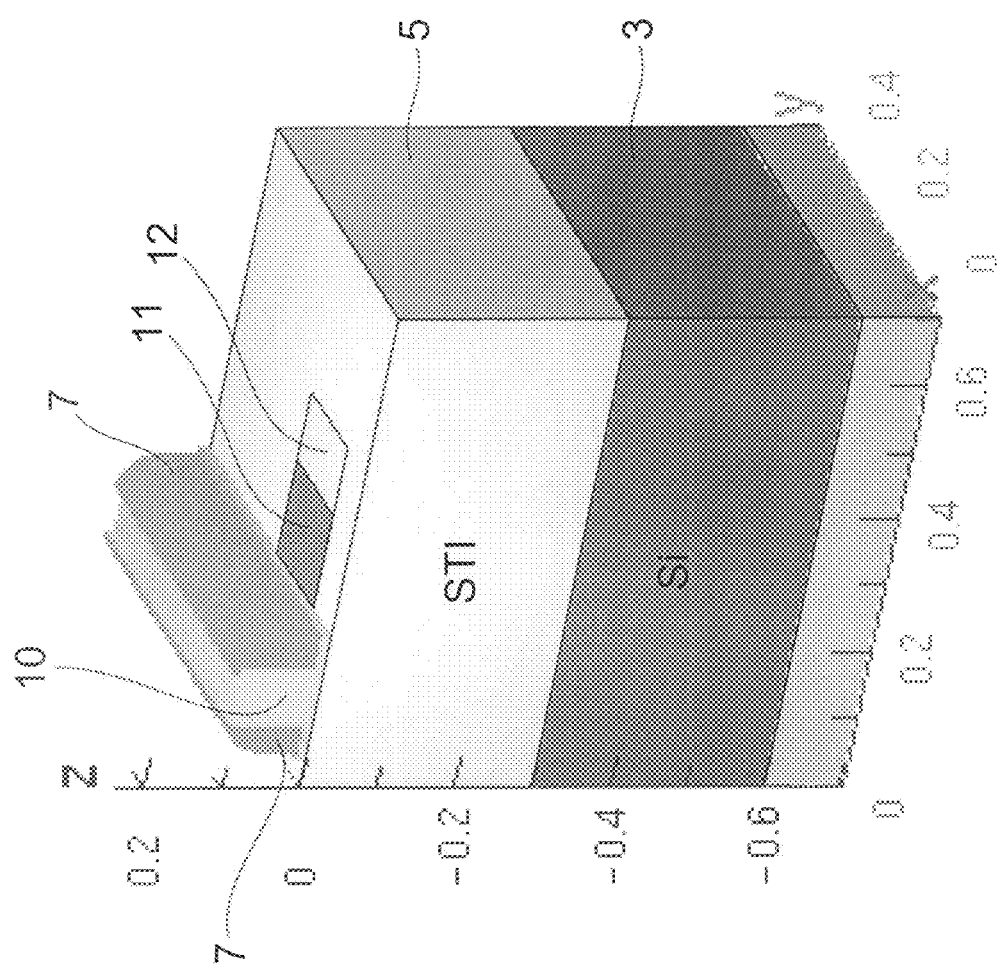
FIG. 3 is a diagrammatical perspective view of the main portion of the semiconductor device.

FIG. 3 is a diagrammatical perspective view of the main portion of the semiconductor device.

The semiconductor device according to the present embodiment includes p-type field effect transistors (pFETs) and n-type field effect transistors (nFETs) which are formed on a single semiconductor substrate.

Each of the pFETs has a p-channel semiconductor active region 11 in which holes contribute to current conduction. The p-channel semiconductor active region 11 has a structure in which p-type source/p-type drain regions 13 are selectively formed in the top surface of an n-type semiconductor region as shown in FIG. 2A. A region between each adjacent two p-type source/p-type drain regions 13 functions as a channel, and, on each of the regions to serve as channels, a gate electrode 10 is provided with a gate insulating film 9 interposed in between. When a desired control voltage is applied to the gate electrodes 10, p-channels are formed, and thereby induced holes flow through the channels under the gate insulating films 9. Accordingly, each of the regions between the p-type source/p-type drain regions 13 conducts, so that current flows therethrough.

Each of the nFETs has an n-channel semiconductor active region 21 in which electrons contribute to current conduction. The n-channel semiconductor active region 21 has a structure in which n-type source/n-type drain regions are selectively formed in the top surface of a p-type semiconductor region. A region between each adjacent two n-type source/n-type drain regions functions as a channel, and, on each of the regions to serve as channels, a gate electrode 10 is provided with a gate insulating film 9 interposed in between, as similar to the pFETs. In each of the nFETs, when a desired control voltage is applied to the gate electrodes 10, n-channels are formed, and thereby induced electrons flow through the channels under the gate insulating films 9. Accordingly, each of the regions between the n-type source/n-type drain regions conducts, so that current flows therethrough.

In the present embodiment, multiple (for example, two in FIG. 1) aforementioned p-channel semiconductor active regions 11 are placed on the semiconductor substrate in a manner that their channel length directions (directions in which current flows) extend approximately parallel to each other. An element isolation insulating layer 5 having a shallow trench isolation (STI) structure lies between each adjacent two p-channel semiconductor active regions 11.

An nFET region is provided adjacent to each of the pFET regions. An aforementioned n-channel semiconductor active region 21 is provided in each of the nFET regions. The n-channel semiconductor active regions 21 are placed on the semiconductor substrate in a manner that their channel length directions (directions in which current flows) extend approximately parallel to the channel length direction of the p-channel semiconductor active regions 11.

Each of the gate electrodes 10 extends over the p-channel semiconductor active regions 11 and the n-channel semiconductor active regions 21 in a direction approximately perpendicular to the channel length direction of the semiconductor active regions.

Although omitted from FIG. 2, a sidewall insulating layer 7 is provided on each of the side surfaces of the gate electrodes 10 as shown in FIG. 3.

The element isolation insulating layer 5, which is made of an insulating material such as silicon oxide or non-doped silicate glass (NGS), dielectrically isolates each of the p-channel semiconductor active regions 11 from the adjacent one of the n-channel semiconductor active regions 21.

On both ends, in the channel length direction, of the p-channel semiconductor active regions 11, the insulating layers 12 made of a material different from that of the element isolation insulating layer 5 are provided. The insulating layers 12 are respectively in contact with the both end surfaces, in the channel length direction, of the p-channel semiconductor active regions 11. Here, the end surfaces extend approximately perpendicular to the channel length direction. Each of the insulating layers 12 has a width in the channel width direction (direction approximately vertical to the channel length direction) approximately as large as that of each p-channel semiconductor active region 11.

Hereinbelow, an example of a method of forming the insulating layers 12 will be described.

As shown in FIG. 3, a surface layer of a semiconductor layer 3 (semiconductor substrate) made of, for example, silicon is selectively etched so that portions to serve as the p-channel semiconductor active regions 11 can remain. Then, the region surrounding the thus-remaining portions is filled with the element isolation insulating layer 5. Subsequently, by using a lithography technique and a reactive ion etching (RIE) technique, the element isolation insulating layer 5 is selectively etched so that portions respectively in contact with the both end surfaces, in the channel length direction of, the p-channel semiconductor active regions 11 can be removed. Thereafter, the recessed portions formed through the above removal process are respectively filled with the insulating layers 12.

When the recessed portions are filled with the insulating layers 12, the gate insulating films 9, the gate electrodes 10 and the sidewall insulating layers 7 are not formed. Under such condition, a material for the insulating layers 12 is stacked on the entire area of the p-channel semiconductor active regions 11 and the element isolation insulating layer 5, and thereafter the insulating layers 12 other than those embedded in the recessed portions of the element isolation insulating layer 5 are removed by, for example, a chemical mechanical polish (CMP) method. In this way, the insulating layers 12 made of a material different from that of the surrounding element isolation insulating layer 5 can be formed at both ends, in the channel length direction, of the p-channel semiconductor active regions 11. Thereafter, the gate insulating films 9, the gate electrodes 10 and the sidewall insulating layers 7 are formed.

Surfaces of the pFETs are covered with a first stress liner 6a, while surfaces of the nFETs are covered with a second stress liner 6b. In FIG. 1, the boundary between a region in which the first stress liner 6a is formed and a region in which the second stress liner 6b is formed is indicated by a chain dashed-two dotted line.

The first stress liner 6a covers surfaces of: the p-channel semiconductor active regions 11, the gate electrodes 10 provided on the channels, the element isolation insulating layer 5 in a region surrounding the p-channel semiconductor active regions 11, and the insulating layers 12.

The second stress liner 6b covers surfaces of: the n-channel semiconductor active regions 21, the gate electrodes 10 provided on the channels, the element isolation insulating layer 5 in a region surrounding the n-channel semiconductor active regions 21.

The first stress liner 6a, which is made of silicon nitride or the like, has an isotropic compression stress, while the second stress liner 6b, which is made of silicon nitride or the like, has an isotropic tensile stress. The stress liners 6a and 6b are respectively made to have compression and tensile stresses with desired magnitudes by adjusting the thicknesses of the stress liners and process conditions for forming the stress liners, such as temperature, pressure, and a kind and a flow rate of a gas to be used.

In general, applying a tensile stress to the channel of an nFET in the both channel length and width directions improves the career (electron) mobility in the nFET, thus improving its performance as a transistor. In the present embodiment, the second stress liner 6b applies an isotropic tensile stress to each channel of the n-channel semiconductor active regions 21 as indicated by outline arrows in FIG. 1. In other words, a tensile stress is applied to each of the n-channel semiconductor active regions 21 in the both channel length and width directions. As a result, the career mobility is improved in the n-channels, so that their performance as transistors can be increased.

By contrast, the first stress liner 6a applies an isotropic compression stress to each channel of the p-channel semiconductor active regions 11. However, in a pFET, it is desirable to apply an anisotropic compression stress in only the channel length direction in order to improve the career (hole) mobility.

Hence, in the present embodiment, the insulating layers 12 are disposed in contact with both ends, in the channel length direction, of the p-channel semiconductor active regions 11 so that a compression stress in only the channel length direction can be selectively increased in each channel of the p-channel semiconductor active regions 11.

Each p-channel semiconductor active region 11 is surrounded by: the insulating layers 12, which are in contact with both ends, in the channel length direction, of each p-channel semiconductor active region 11; and the element isolation insulating layer 5, which is in contact with the side surfaces, approximately parallel to the channel length direction, of each p-channel semiconductor active region 11.

The insulating layers 12 are made of a material having a larger compression stress to silicon than the element isolation insulating layer 5 when measured at room temperature, and apply compression stresses in the channel length direction to channels of the p-channel semiconductor active regions 11. For example, the insulating layers 12 having the above function may be made of a material (such as silicon nitride) having a smaller thermal expansion coefficient than silicon oxide and NSG consisting the element isolation insulating layer 5. Note that the element isolation insulating layer 5 may have any kind and magnitude of stress in accordance with the process conditions, and may be made of a material having substantially no stress.

In the present embodiment, by using components (insulating layers 12) in addition to the first stress liner 6a, a compression stress selectively increased in only the channel length direction can be applied to each channel of the p-channel semiconductor active regions 11. Accordingly, an isotropic compression stress applied by the first stress liner 6a can be corrected to selectively increase in the channel length direction as compared to in the channel width direction. As a result, the career (hole) mobility can be improved in the pFETs.

The n-channel semiconductor active regions 21, which are surrounded by only the element isolation insulating layer 5, are not in contact with any of the insulating layers 12 each having a larger compression stress than the element isolation insulating layer 5. Accordingly, in the n-channel semiconductor active regions 21, no stress (compression stress of the insulating layers 12) to prevent the effect of the isotropic tensile stress of the second stress liner 6b takes effect. Thus, the isotropic tensile stress of the second stress liner 6b improves the career (electron) mobility in the nFETs.

As described above, according to the present embodiment, a stress appropriate for a pFET is applied to each of the pFETs while a stress appropriate for an nFET is applied to each of the nFETs, in a semiconductor device in which one or more pFETs and one or more nFETs are formed on a single semiconductor substrate (in a single chip). This improves the career mobility in both types of transistors, thus increasing the performance of the entire semiconductor device.

Note that, the element isolation insulating layer 5 having an isotropic tensile stress may be used in the first embodiment.

In this case, in each of the n-channel semiconductor active regions 21 surrounded by only the element isolation insulating layer 5, an isotropic tensile stress of the element isolation insulating layer 5 as well as that of the second stress liner 6b takes effect, so that the career mobility is further increased in the nFETs.

Meanwhile, in each of the p-channel semiconductor active regions 11 surrounded by the insulating layers 12 and the element isolation insulating layer 5, which are respectively in contact with both ends, in the channel length direction, and the side surfaces, approximately parallel to the channel length direction, of the p-channel semiconductor active region 11, the insulating layers 12 can apply a compression stress in the channel length direction to the channels, and the element isolation insulating layer 5 can apply a tensile stress in the channel width direction to the channels. In other words, in each of the p-channel semiconductor active regions 11, anisotropic stresses respectively appropriate for the channel length and width directions, such as a compression stress in the channel length direction and a tensile stress in the channel width direction, take effect, so that the career mobility is further increased in the pFETs.

Hereinafter, description will be given of the result of the simulation where a compression stress in the channel length direction is applied to channels in a pFET having the structure according to the present embodiment.

Figure 4:
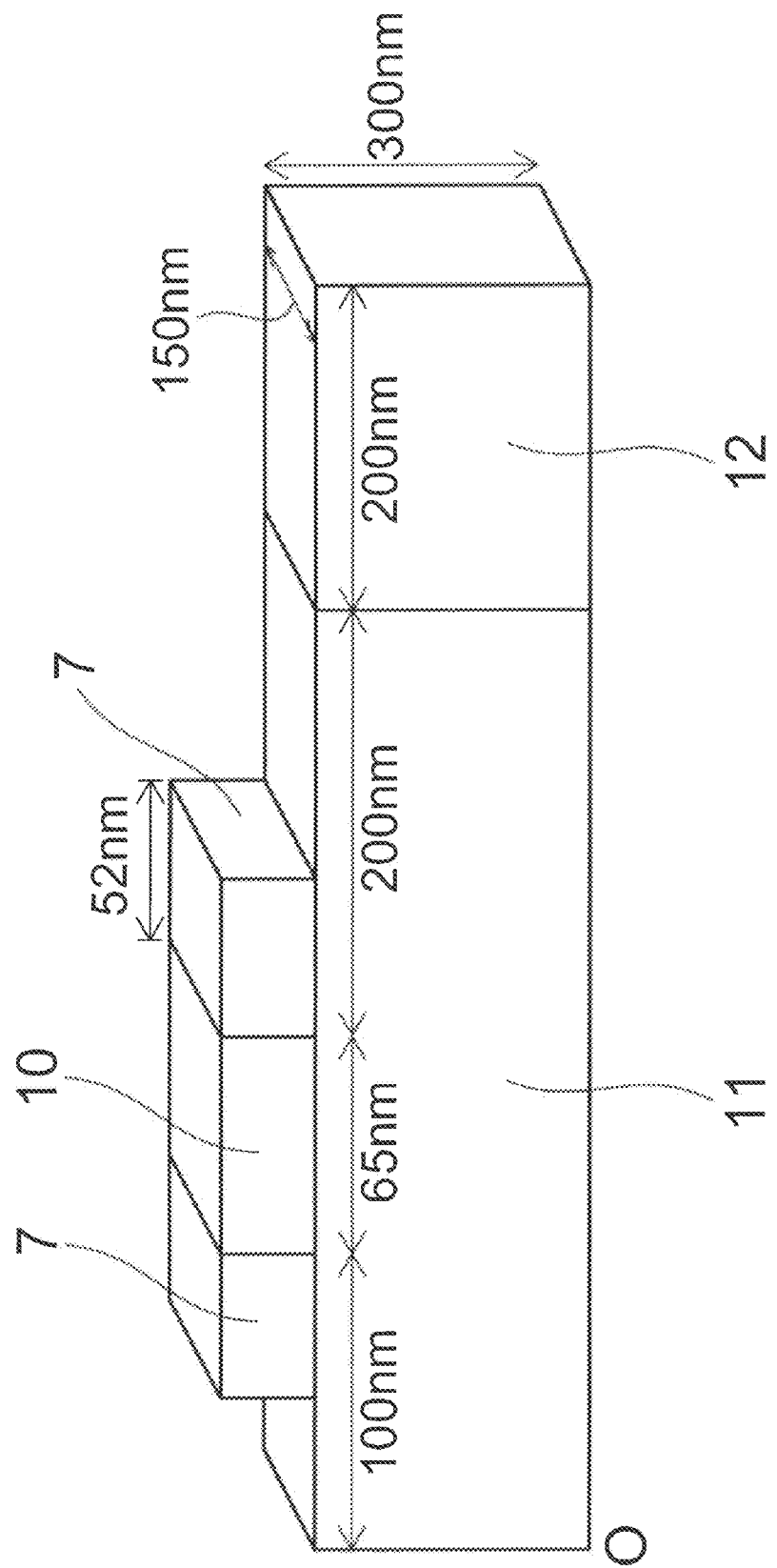
FIG. 4 shows the dimension and structure of a pFET model used in the simulation.

FIG. 4 shows the dimension and structure of a pFET model used in the simulation.

The pFET model used in the simulation had the following dimension. A length (channel length), in the direction in which current flows, of the channel under each gate electrode 10 was 65 nm. A length between the channel and the center point O in the channel length direction in each p-channel semiconductor active region 11 was 100 nm. A length between the channel and an end of the p-channel semiconductor active region 11 was 200 nm. A length, in the channel length direction, of each sidewall insulating layer 7 was 52 nm. A length, in the channel length direction, of each insulating layer 12 was 200 nm. A thickness of each of the p-channel semiconductor active region 11 and the insulating layer 12 was 300 nm. A width, in the channel width direction, of the p-channel semiconductor active region 11 and the insulating layer 12 was 150 nm In this model, the change in the stress applied to the channel was simulated using the insulating layers 12 respectively with compression stresses of 1.5 GPa, 3 GPa, 7 GPa, 15 GPa, 30 GPa, 50 GPa, 70 GPa, 100 GPa measured by using the no insulating layer 12 case as the base.

Figure 5:
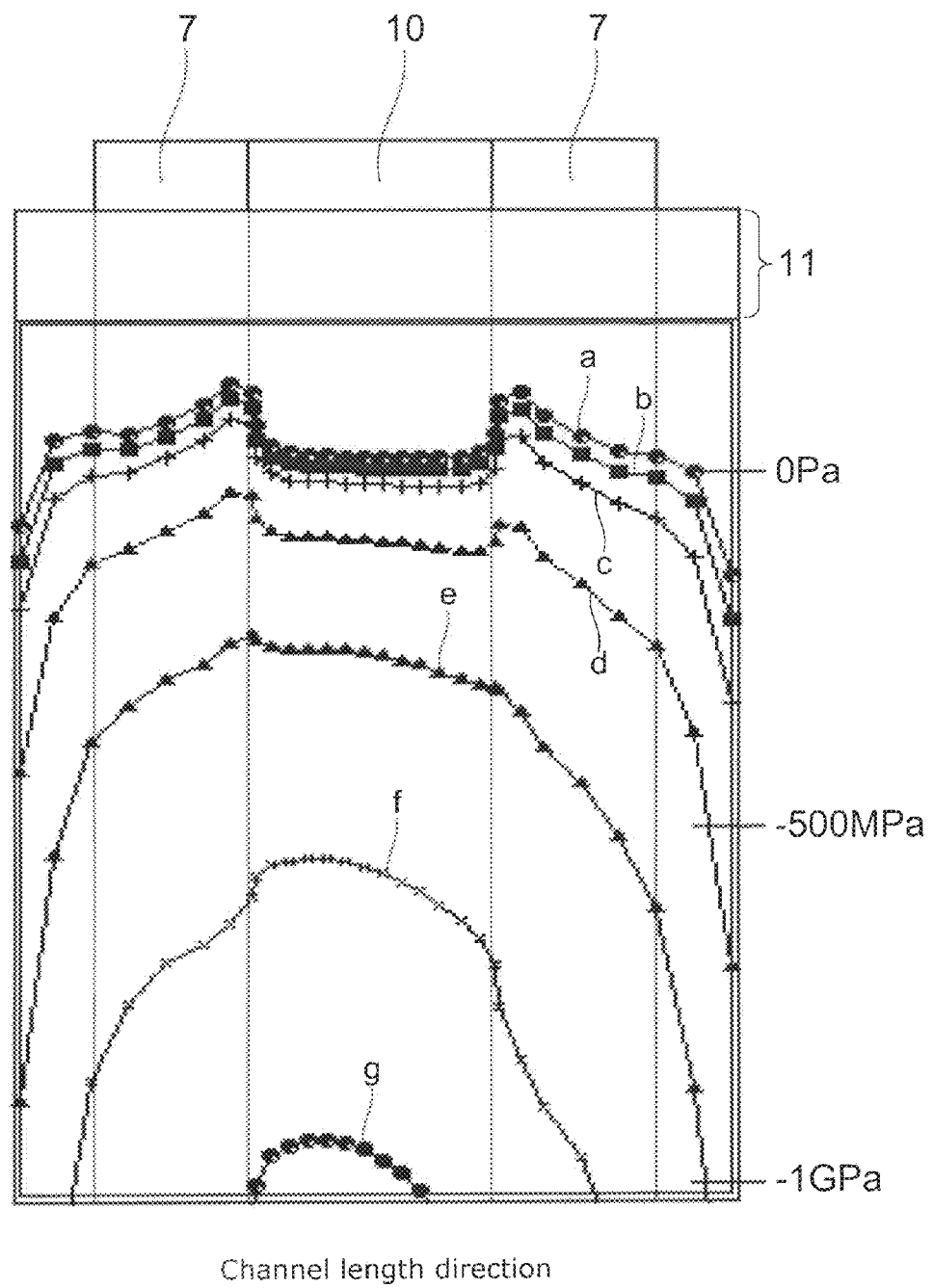
FIGS. 5 and 6 show the results of the simulation.
Figure 6:
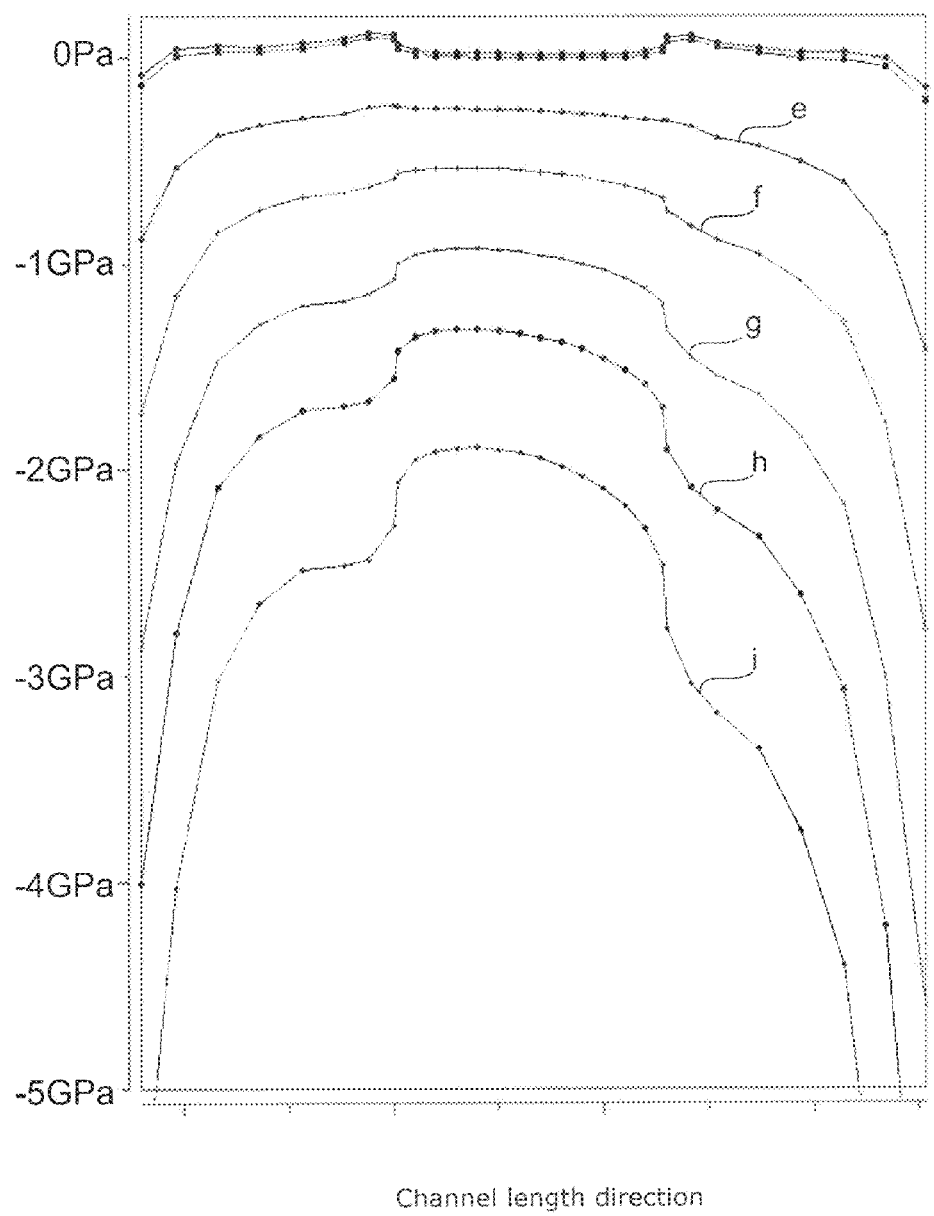

FIGS. 5 and 6 show the results of the simulation.

In FIGS. 5 and 6, the horizontal axis represents positions in the channel length direction, and a portion near the center of the horizontal axis corresponds to the position of the channel. The vertical axis represents stresses in the channel length direction in the p-channel semiconductor active region 11 (silicon layer). A minus symbol "−" immediately ahead of each numeric value represents that the corresponding stress is a compression stress. FIG. 6 shows a region along a vertical axis representing larger compression stresses than FIG. 5.

In FIGS. 5 and 6, graphs a to i represent the simulation results in the cases where the insulating layers 12 have compression stresses of 0 GPa (no insulating layer 12 is provided), 1.5 GPa, 3 GPa, 7 GPa, 15 GPa, 30 GPa, 50 GPa, 70 GPa and 100 GPa, respectively.

Nowadays, silicon nitride is often used as a material capable of having a relatively large stress, and is considered to be made to have a compression stress of at most around 2 GPa to 3 GPa so far. In the structure according to the present embodiment, when each insulating layer 12 has a compression stress of 3 GPa (shown in the graph c of FIG. 5), a compression stress of approximately 100 MPa can be applied to each channel in the channel length direction. Even a compression stress as small as 100 MPa can significantly contribute to the increase in the career mobility in each channel of the pFETs.

Furthermore, considering the fact that silicon nitride having a larger and larger stress has been developed, it can be expected that an insulating layer having a still larger compression stress will be developed in the future. When such a material is used as the material of the insulating layers 12 in the present embodiment, each channel stress will further be increased as shown in the simulation results of FIGS. 5 and 6. Accordingly, it can be expected that the career mobility in the pFETs will further be improved.

In the first embodiment, a stress liner 6a and 6b are provided on the nFETs and pFETs as shown in FIGS. 2A and 2B. However, it may be possible that the stress liner 6a and 6b are not provided.

Second Embodiment

Figure 7:
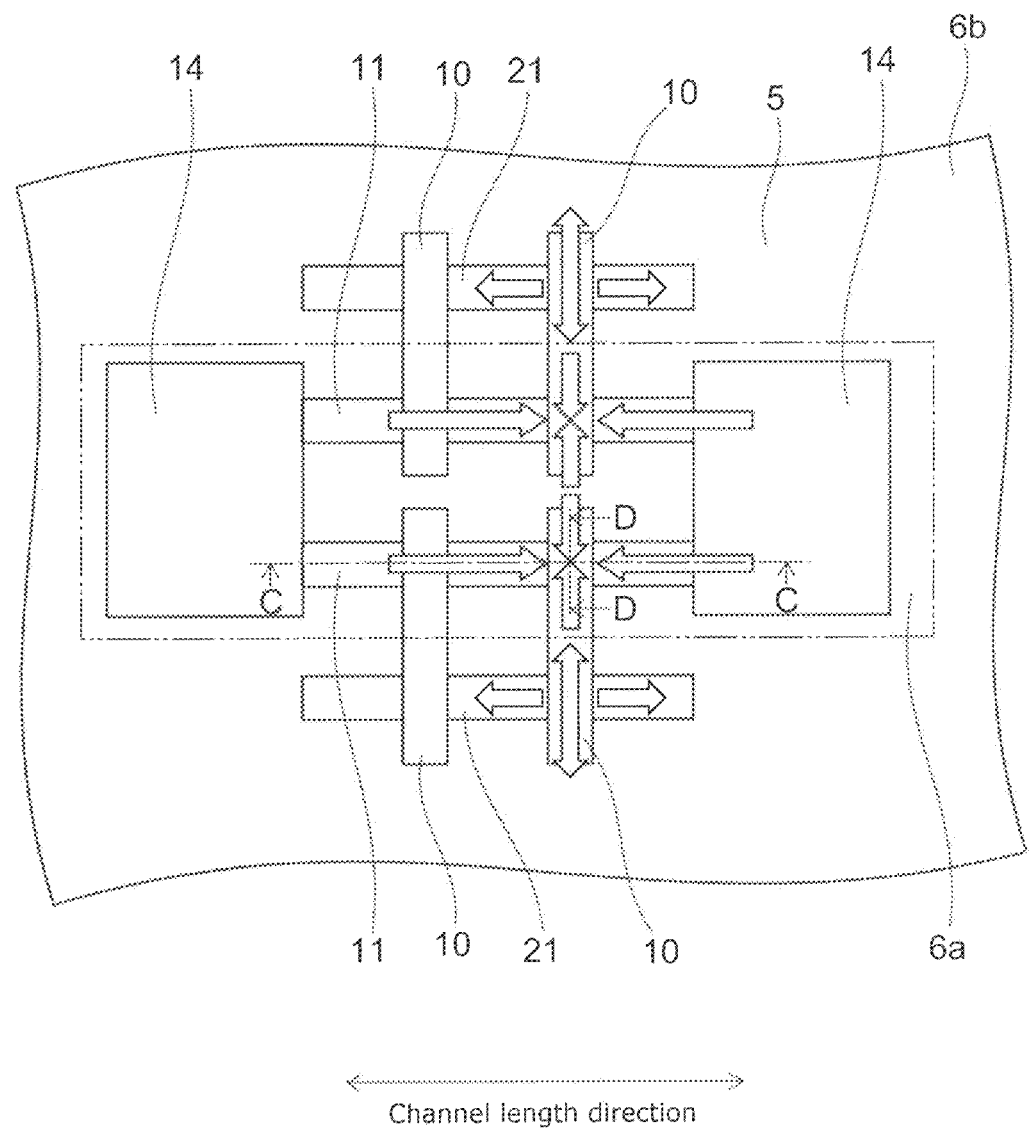
FIG. 7 is a schematic view showing a planar layout of the main portion of a semiconductor device according to a second embodiment.

FIG. 7 is a schematic view showing a planar layout of the main portion of a semiconductor device according to a second embodiment of the present invention.

Figure 8A:
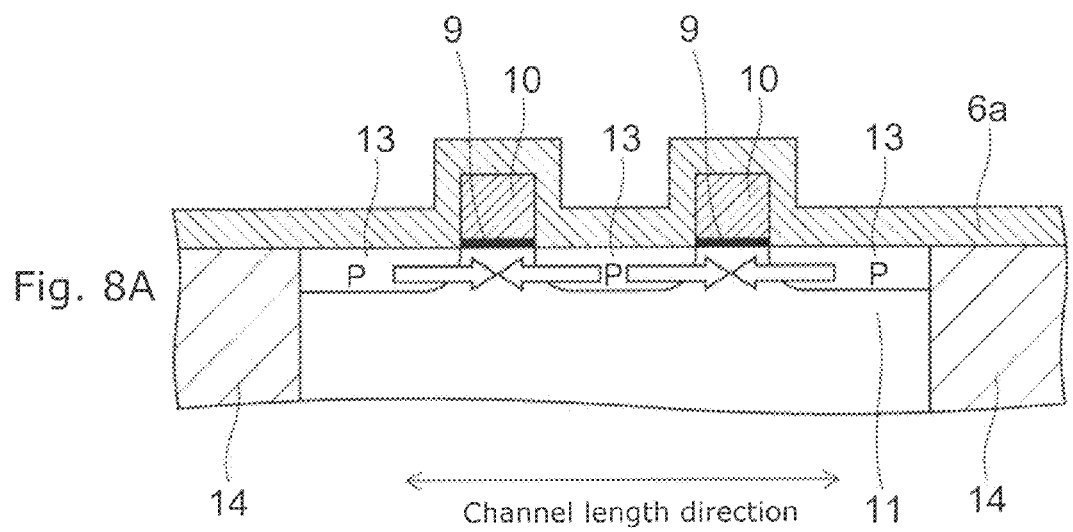
FIG. 8A is a cross-sectional view taken along line C-C in FIG. 7.
Figure 8B:
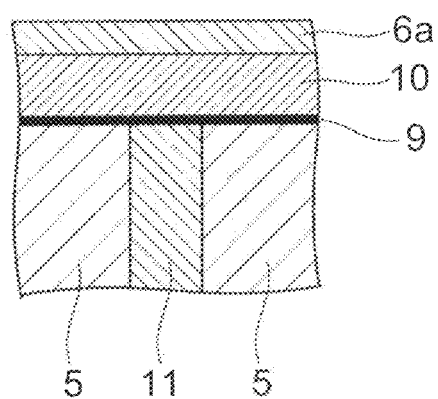
FIG. 8B is a cross-sectional view taken along line D-D in FIG. 7.

FIG. 8A is a cross-sectional view taken along line C-C in FIG. 7. FIG. 8B is a cross-sectional view taken along line D-D in FIG. 7.

Figure 9:
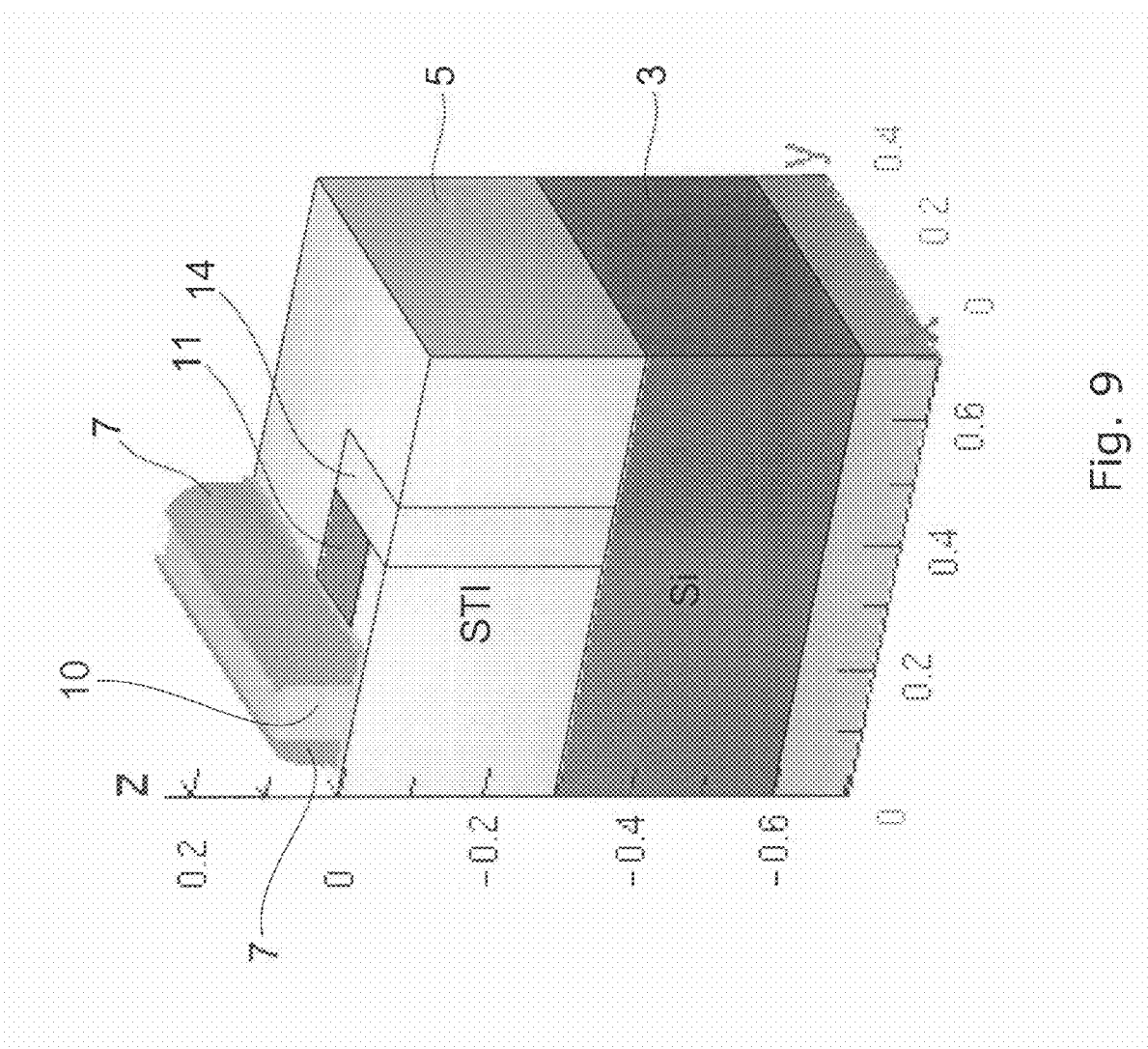
FIG. 9 is a diagrammatic perspective view of the main portion of the semiconductor device.

FIG. 9 is a diagrammatic perspective view of the main portion of the semiconductor device.

The semiconductor device according to the present embodiment also includes pFETs and nFETs formed on a single semiconductor substrate as in the aforementioned first embodiment. Multiple aforementioned p-channel semiconductor active regions 11 for pFETs and multiple aforementioned n-channel semiconductor active regions 21 for nFETs are placed on the semiconductor substrate in a manner that their channel length directions extend approximately parallel to each other. An element isolation insulating layer 5 lies between each adjacent pair of the p-channel and n-channel semiconductor active regions 11 and 21, as well as between each adjacent two p-channel semiconductor active regions 11.

On both ends, in the channel length direction, of the p-channel semiconductor active regions 11, the insulating layers 14 made of a material different from that of the element isolation insulating layer 5 are provided. The insulating layers 14 are in contact with the both end surfaces, in the channel length direction, of the p-channel semiconductor active regions 11. Here, the end surfaces extend approximately perpendicular to the channel length direction. Each of the insulating layers 14 has a width in the channel width direction larger than that of each p-channel semiconductor active region 11, and is provided as a component (integral component) common to the multiple p-channel semiconductor active regions 11.

Surfaces of the pFETs are covered with a first stress liner 6a having an isotropic compression stress, while surfaces of the nFETs are covered with a second stress liner 6b having an isotropic tensile stress. In FIG. 7, the boundary between a region in which the first stress liner 6a is formed and a region in which the second stress liner 6b is formed is indicated by a dashed-two dotted line.

In the present embodiment as well, the second stress liner 6b applies an isotropic tensile stress to each channel of the n-channel semiconductor active regions 21. In other words, a tensile stress is applied to each of the n-channel semiconductor active regions 21 in the both channel length and width directions. As a result, the career mobility is improved in the n-channels, so that their performance as transistors can be increased.

On the other hand, each p-channel semiconductor active region 11 is surrounded by: the insulating layers 14, which are in contact with both ends, in the channel length direction, of each p-channel semiconductor active region 11; and the element isolation insulating layer 5, which is in contact with the side surfaces, approximately parallel to the channel length direction, of each p-channel semiconductor active region 11.

The insulating layers 14 are made of a material having a larger compression stress to silicon than the element isolation insulating layer 5 when measured at room temperature, and apply compression stresses in the channel length direction to channels of the p-channel semiconductor active regions 11. For example, the insulating layers 14 having the above function may be made of a material (such as silicon nitride) having a smaller thermal expansion coefficient than silicon oxide and NSG consisting the element isolation insulating layer 5. Note that the element isolation insulating layer 5 may have any kind and magnitude of stress in accordance with the process conditions, and may be made of a material having substantially no stress.

In the present embodiment as well, by using components (insulating layers 14) in addition to the first stress liner 6a, a compression stress selectively increased in only the channel length direction can be applied to each channel of the p-channel semiconductor active regions 11. Accordingly, an isotropic compression stress applied by the first stress liner 6a can be corrected to selectively increase in the channel length direction as compared to in the channel width direction. As a result, the career (hole) mobility can be improved in the pFETs.

The n-channel semiconductor active regions 21, which are surrounded by only the element isolation insulating layer 5, are not in contact with any of the insulating layers 14 each having a compression stress. Accordingly, in the n-channel semiconductor active regions 21, no stress (compression stress of the insulating layers 14) to prevent the effect of the isotropic tensile stress of the second stress liner 6b takes effect. Thus, the isotropic tensile stress of the second stress liner 6b improves the career (electron) mobility in the nFETs.

As described above, according to the present embodiment, a stress appropriate for a pFET is applied to each of the pFETs while a stress appropriate for an nFET is applied to each of the nFETs, in a semiconductor device in which one or more pFETs and one or more nFETs are formed on a single semiconductor substrate (in a single chip). This improves the career mobility in both types of transistors, thus increasing the performance of the entire semiconductor device.

Note that, the element isolation insulating layer 5 having an isotropic tensile stress may be used in the second embodiment as well.

In this case, in each of the n-channel semiconductor active regions 21 surrounded by only the element isolation insulating layer 5, an isotropic tensile stress of the element isolation insulating layer 5 as well as that of the second stress liner 6b takes effect, so that the career mobility is also increased in the nFETs.

Meanwhile, in each of the p-channel semiconductor active regions 11 surrounded by the insulating layers 14 and the element isolation insulating layer 5, which are respectively in contact with both ends, in the channel length direction, and the side surfaces, approximately parallel to the channel length direction, of the p-channel semiconductor active region 11, the insulating layers 14 can apply a compression stress in the channel length direction to the channels, and the element isolation insulating layer 5 can apply a tensile stress in the channel width direction to the channels. In other words, in each of the p-channel semiconductor active regions 11, anisotropic stresses respectively appropriate for the channel length and width directions, such as a compression stress in the channel length direction and a tensile stress in the channel width direction, take effect, so that the career mobility is further increased in the pFETs.

Hereinafter, description will be given of the result of the simulation where a compression stress in the channel length direction is applied to channels in a pFET having the structure according to the present embodiment.

Figure 10:
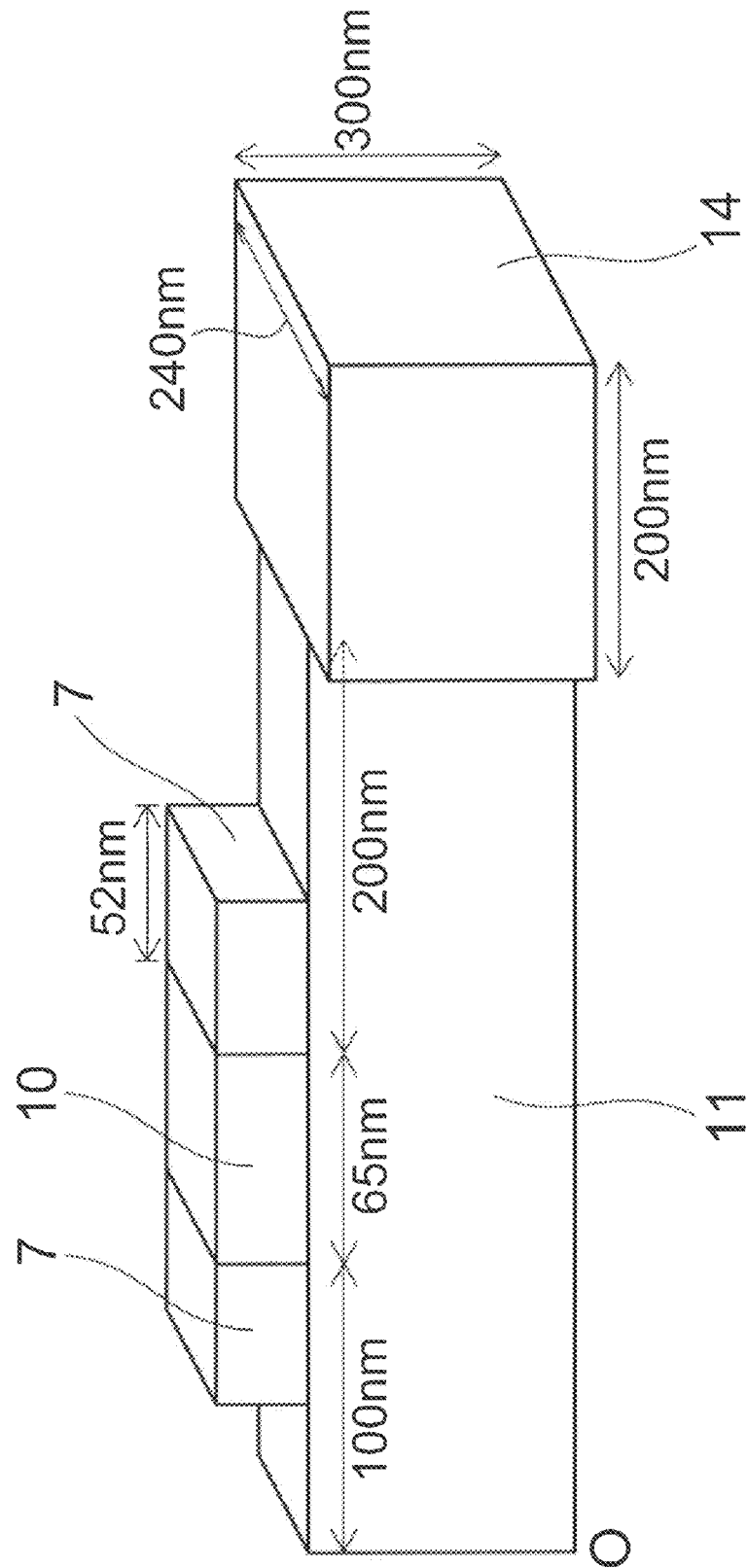
FIG. 10 shows the dimension and structure of a pFET model used in the simulation.

FIG. 10 shows the dimension and structure of a pFET model used in the simulation.

The pFET model used in the simulation had the same dimension as the first embodiment described with reference to FIG. 4, in terms of each p-channel semiconductor active region 11, each gate electrode 10 and each sidewall insulating layer 7. Moreover, as also similar to the first embodiment, a length, in the channel length direction, of each insulating layer 14 was 200 nm, and a thickness of each of the p-channel semiconductor active region 11 and the insulating layer 14 was 300 nm. The dimension of the pFET model used in the simulation of the second embodiment is difference from that of the first embodiment in that a width, in the channel width direction, of the insulating layer 14 was 240 nm, which is larger than the width, in the channel width direction, of the p-channel semiconductor active region 11. Each center, in the channel width direction, of the insulating layer 14 is approximately on the middle line, perpendicular to the channel width direction, of the p-channel semiconductor active regions 11, and the insulating layer 14 extends in the channel width direction farther than the both ends of the p-channel semiconductor active region 11.

In this model, the change in the stress applied to the channel was simulated using the insulating layers 14 respectively with compression stresses of 1.5 GPa, 3 GPa, 7 GPa, 15 GPa, 30 GPa, 50 GPa, 70 GPa, 100 GPa measured by using the no insulating layer 14 case as the base.

Figure 11:
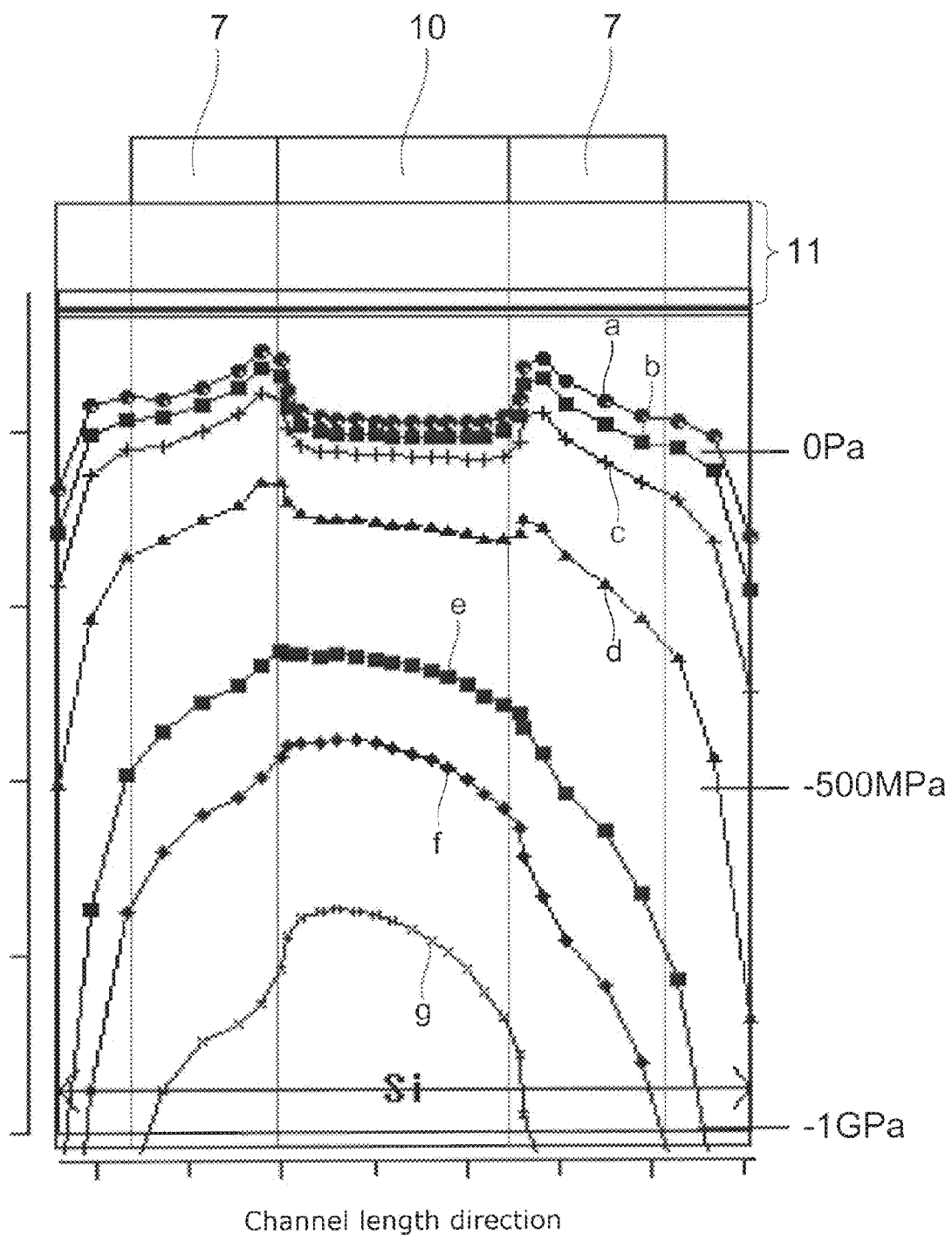
FIGS. 11 and 12 show the results of the simulation.
Figure 12:
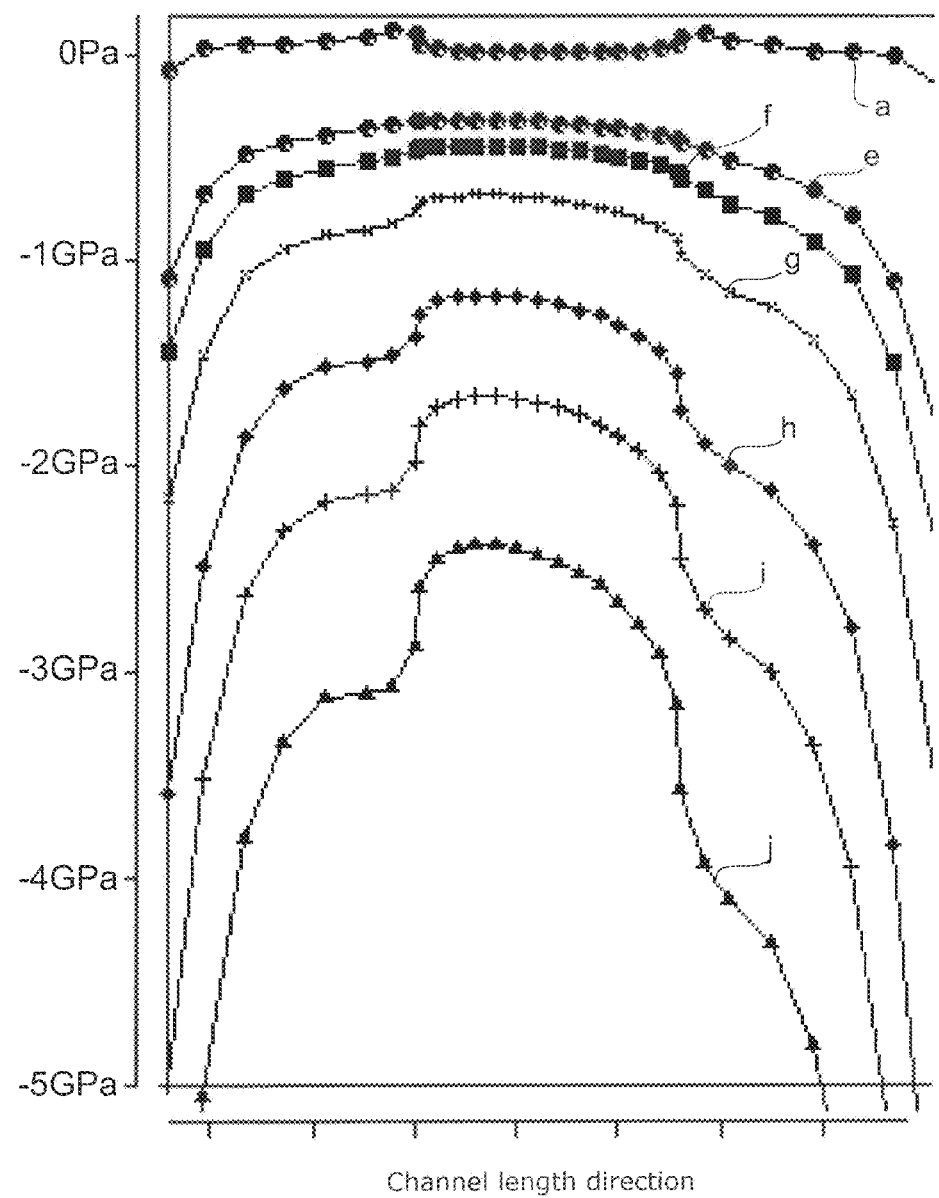

FIGS. 11 and 12 show the results of the simulation.

In FIGS. 11 and 12, the horizontal axis represents positions in the channel length direction, and a portion near the center of the horizontal axis corresponds to the position of the channel. The vertical axis represents stresses in the channel length direction in the p-channel semiconductor active region 11 (silicon layer). A minus symbol "−" immediately ahead of each numeric value represents that the corresponding stress is a compression stress. FIG. 12 shows a region along a vertical axis representing larger compression stresses than FIG. 11.

In FIGS. 11 and 12, graphs a to i represent the simulation results in the cases where the insulating layers 14 have compression stresses of 0 GPa (no insulating layer 14 is provided), 1.5 GPa, 3 GPa, 7 GPa, 15 GPa, 30 GPa, 50 GPa, 70 GPa and 100 GPa, respectively.

The comparison with the results of the simulation using the pFET having the structure according to the first embodiment shown in FIGS. 5 and 6 shows that, when the insulating layers 12 and 14 have the same compression stress, the insulating layers 14 each having a larger width in the channel width direction than the p-channel semiconductor active regions 11 can apply a larger compression stress to each channel of the pFETs than the insulating layers 12. Thus, the structure according to the second embodiment is more effective at increasing the career (hole) mobility of the pFETs.

Third Embodiment

Figure 13:
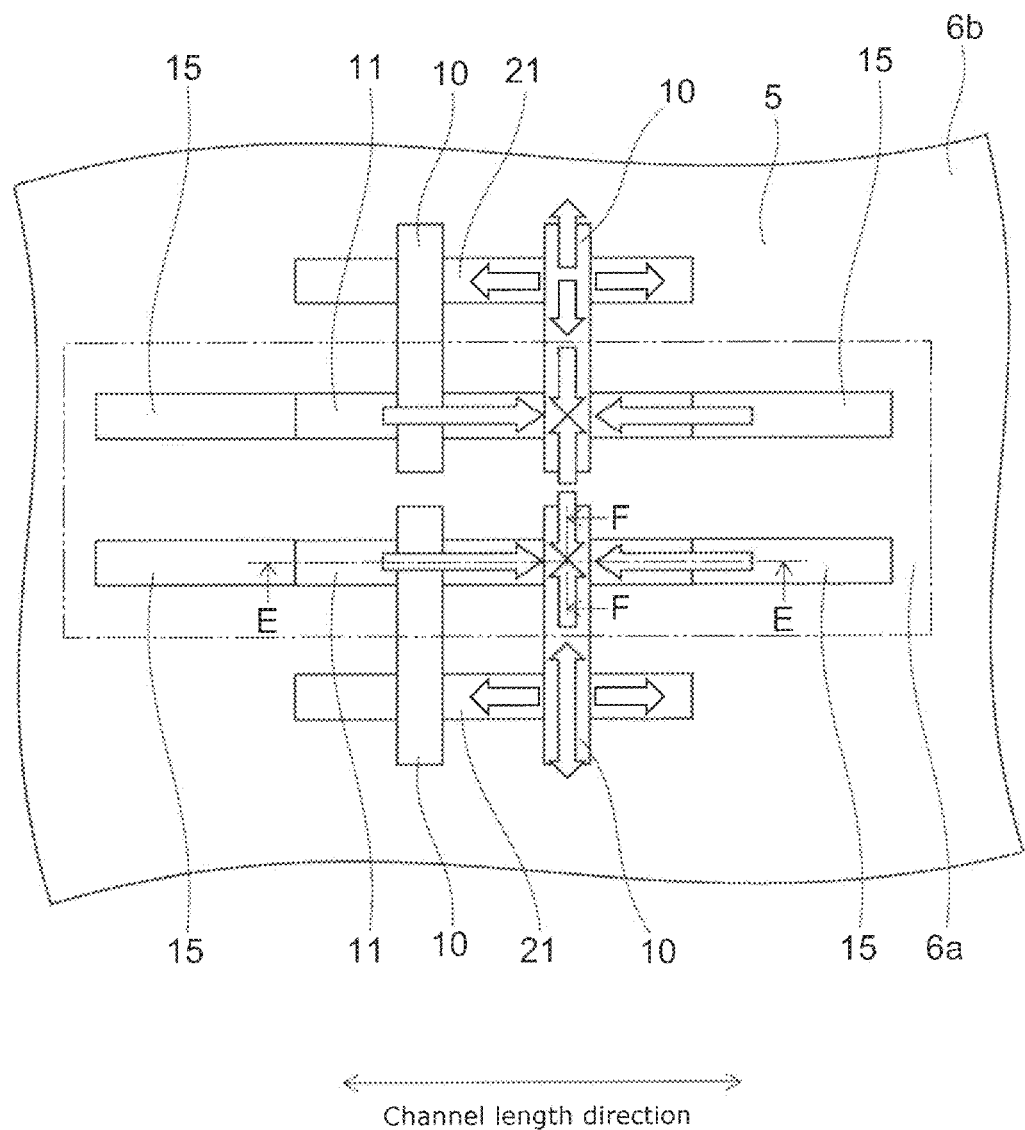
FIG. 13 is a schematic view showing a planar layout of the main portion of a semiconductor device according to a third embodiment.

FIG. 13 is a schematic view showing a planar layout of the main portion of a semiconductor device according to a third embodiment of the present invention.

Figure 14A:
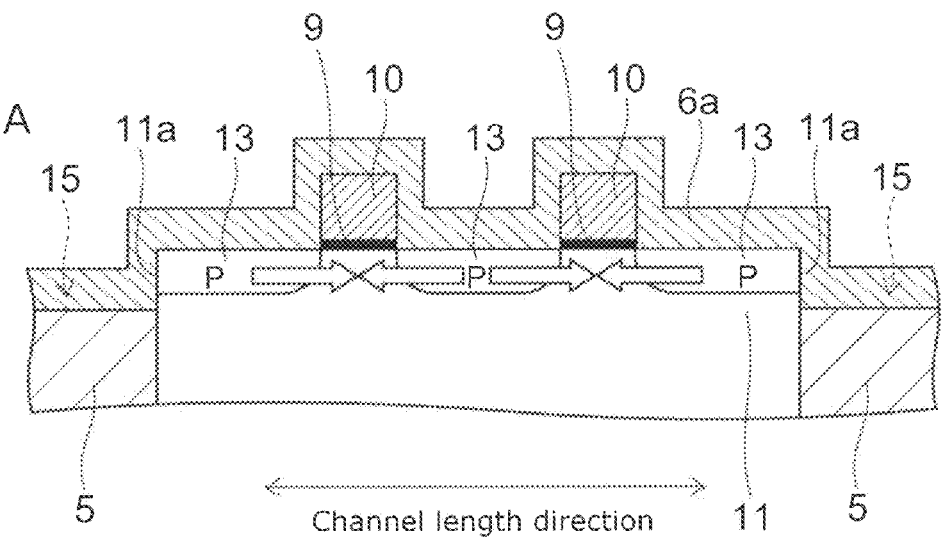
FIG. 14A is a cross-sectional view taken along line E-E in FIG. 13.
Figure 14B:
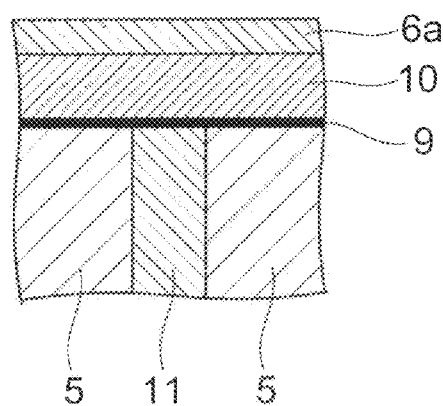
FIG. 14B is a cross-sectional view taken along line F-F in FIG. 13.

FIG. 14A is a cross-sectional view taken along line E-E in FIG. 13. FIG. 14B is a cross-sectional view taken along line F-F in FIG. 13.

FIG. 15 is a diagrammatic perspective view of the main portion of the semiconductor device.

The semiconductor device according to the present embodiment also includes pFETs and nFETs formed on a single semiconductor substrate as in the aforementioned first embodiment. Multiple aforementioned p-channel semiconductor active regions 11 for pFETs and multiple aforementioned n-channel semiconductor active regions 21 for nFETs are placed on the semiconductor substrate in a manner that their channel length directions extend approximately parallel to each other. An element isolation insulating layer 5 lies between each adjacent pair of the p-channel and n-channel semiconductor active regions 11 and 21, as well as between each adjacent two p-channel semiconductor active regions 11.

The element isolation insulating layer 5 is partially recessed so that recessed portions 15 can be formed in contact with both end surfaces, in the channel length direction, of the p-channel semiconductor active regions 11, and that the top surfaces of the recessed portions 15 can become lower than the top surfaces of the p-channel semiconductor active regions 11, as shown in FIG. 14A. In other words, in the element isolation insulating layer 5 surrounding the p-channel semiconductor active regions 11 and the n-channel semiconductor active regions 21, the recessed portions 15 are selectively formed in a manner that the recessed portions 15 are respectively in contact with end surfaces, in the channel length direction, of the p-channel semiconductor active regions 11. The element isolation insulating layer 5 is substantially flush with the top surfaces of the p-channel semiconductor active regions 11 and the n-channel semiconductor active regions 21 in a portion outside of where the recessed portions 15 are formed.

Surfaces of the pFETs are covered with a first stress liner 6a having an isotropic compression stress, while surfaces of the nFETs are covered with a second stress liner 6b having an isotropic tensile stress. In FIG. 13, the boundary between a region in which the first stress liner 6a is formed and a region in which the second stress liner 6b is formed is indicated by a dashed-two dotted line.

The first stress liner 6a covers surfaces of: the p-channel semiconductor active regions 11, the gate electrodes 10 provided on the channels, and the element isolation insulating layer 5 in a region surrounding the p-channel semiconductor active regions 11. Between the top surfaces of the recessed portions 15 of the element isolation insulating layer 5 and the top surfaces of the p-channel semiconductor active regions 11, steps are respectively formed as shown in FIG. 14A, and the first stress liner 6a covers the steps.

The second stress liner 6b covers surfaces of: the n-channel semiconductor active regions 21, the gate electrodes 10 provided on the channels, the element isolation insulating layer 5 in a region surrounding the n-channel semiconductor active regions 21.

In the present embodiment as well, the second stress liner 6b applies an isotropic tensile stress to each channel of the n-channel semiconductor active regions 21. In other words, a tensile stress is applied to each of the n-channel semiconductor active regions 21 in the both channel length and width directions. As a result, the career mobility is improved in the n-channels, so that their performance as transistors can be increased.

Moreover, in the present embodiment, the recessed portions 15 of the element isolation insulating layer 5 are provided at both ends, in the channel length direction, of the p-channel semiconductor active regions 11. Accordingly, both end surfaces 11a, in the channel length direction, of a surface layer of the p-channel semiconductor active regions 11 are covered with not the element isolation insulating layer 11 but the first stress liner 6a. This structure causes the compression stress of the first stress liner 6a to be applied to each channel of the p-channel semiconductor active regions 11, in the channel length direction from both of the end surfaces 11a. The side surfaces, approximately parallel to the channel length direction, of the p-channel semiconductor active regions 11 are covered with the element isolation insulating layer 5, and are not in contact with the first stress liner 6a.

Thus, a compression stress selectively increased in only the channel length direction can be applied to each channel of the p-channel semiconductor active regions 11. Accordingly, a compression stress can be increased only in the channel length direction as compared to in the channel width direction. As a result, the career (hole) mobility can be improved in the pFETs.

In the n-channel semiconductor active regions 21, which are surrounded by only the element isolation insulating layer 5, no stress to prevent the effect of the isotropic tensile stress of the second stress liner 6b takes effect. Thus, the isotropic tensile stress of the second stress liner 6b improves the career (electron) mobility in the nFETs.

As described above, according to the present embodiment, a stress appropriate for a pFET is applied to each of the pFETs while a stress appropriate for an nFET is applied to each of the nFETs, in a semiconductor device in which one or more pFETs and one or more nFETs are formed on a single semiconductor substrate (in a single chip). This improves the career mobility in both types of transistors, thus increasing the performance of the entire semiconductor device.

Note that, although the first stress liner 6a is formed so as only to cover the inner wall surfaces of the recessed portions 15, the recessed portions 15 may be completely filled with the first stress liner 6a.

Hereinafter, description will be given of the result of the simulation where a compression stress in the channel length direction is applied to channels in a pFET having the structure according to the present embodiment.

Figure 16:
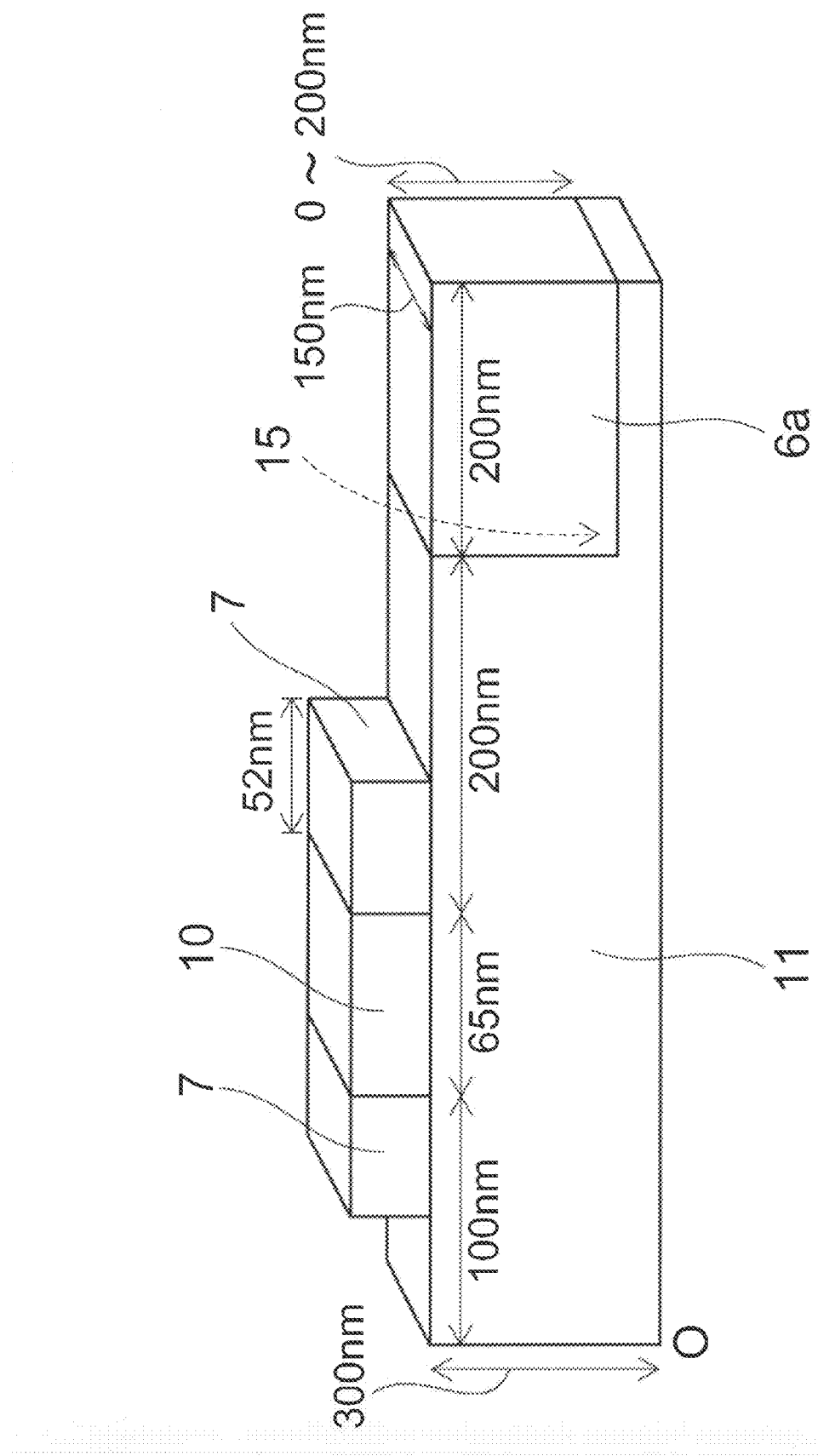
FIG. 16 shows the dimension and structure of a pFET model used in the simulation.

FIG. 16 shows the dimension and structure of a pFET model used in the simulation. The pFET model used in the simulation had a structure in which the recessed portions 15 were completely filled with the first stress liner 6a.

The pFET model used in the simulation had the following dimension. A length (channel length), in the direction in which current flows, of the channel under each gate electrode 10 was 65 nm. A length between the channel and the center point O in the channel length direction in each p-channel semiconductor active region 11 was 100 nm. A length between the channel and an end of the p-channel semiconductor active region 11 was 200 nm. A length, in the channel length direction, of each sidewall insulating layer 7 was 52 nm. A length, in the channel length direction, of each recessed portion 15 was 200 nm. A thickness of the p-channel semiconductor active region 11 was 300 nm. A width, in the channel width direction, of the p-channel semiconductor active region 11 and the insulating layer 12 was 150 nm.

A compression stress in the channel length direction applied to the channel was simulated with depth of the recessed portions 15 varied. The compression stress and film thickness of the first stress liner 6a were fixedly set to 1.5 GPa and 50 nm, respectively.

Figure 17:
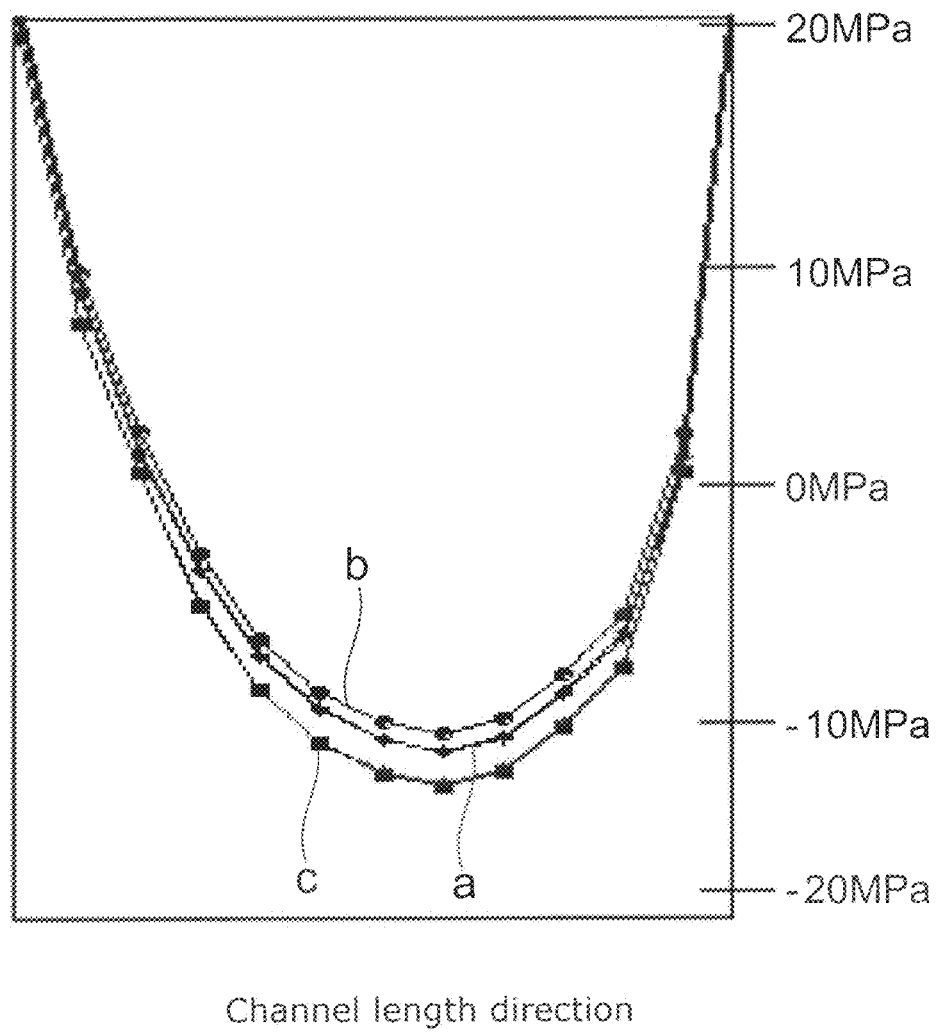
FIG. 17 shows the results of the simulation.

FIG. 17 shows the results of the simulation.

In FIG. 17, the horizontal axis represents positions in the channel length direction, and a portion near the center of the horizontal axis corresponds to the position of the channel. The vertical axis represents stresses in the channel length direction in the p-channel semiconductor active region 11 (silicon layer). A minus symbol "−" immediately ahead of each numeric value represents that the corresponding stress is a compression stress.

In FIG. 17, graphs a to c represent the simulation results in the cases where the recessed portions 15 have the depths of 5 nm, 10 nm and 20 nm to 30 nm, respectively.

As is clear from the results shown in FIG. 17, the compression stress in the channel length direction applied to the channel is increased particularly when the depth of the recessed portions 15 is 20 nm to 30 nm.

Then, a compression stress in the channel length direction applied to the channel was simulated with a compression stress of the first stress liner 6a varied. The depth of the recessed portions 15 and the thickness of the first stress liner 6a were fixedly set to 200 nm and 50 nm, respectively.

Figure 18:
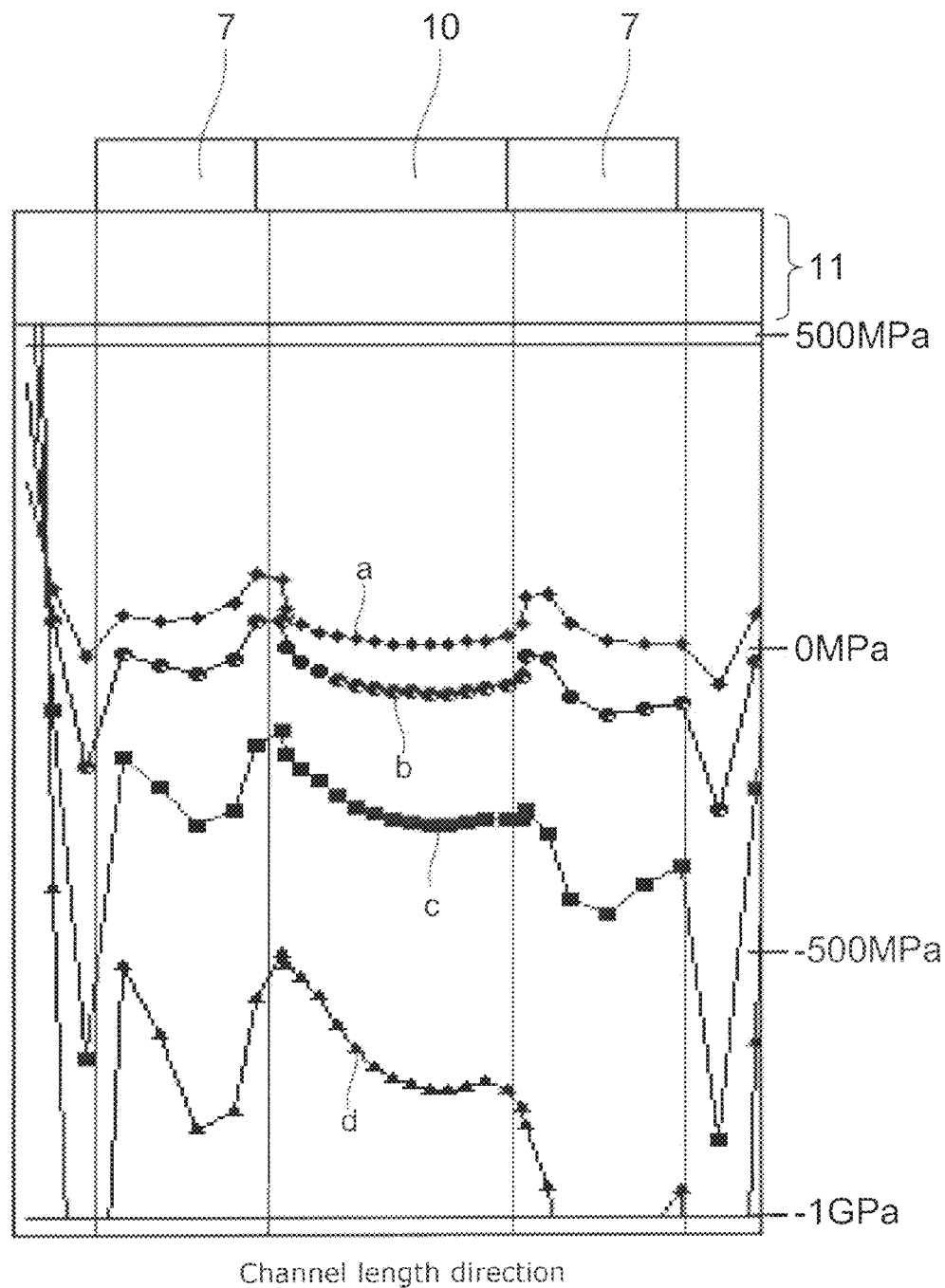
FIG. 18 shows the results of the simulation.

FIG. 18 shows the results of the simulation.

In FIG. 18, the horizontal axis represents positions in the channel length direction, and a portion near the center of the horizontal axis corresponds to the position of the channel. The vertical axis represents stresses in the channel length direction in the p-channel semiconductor active region 11 (silicon layer). A minus symbol "−" immediately ahead of each numeric value represents that the corresponding stress is a compression stress.

In FIG. 18, graphs a to d represent the simulation results in the cases where the first stress liners 6a have compression stresses of 1.5 GPa, 3 GPa, 7 GPa and 15 GPa, respectively.

Nowadays, silicon nitride is often used as a material capable of having a relatively large stress, and is considered to be made to have a compression stress of at most around 2 GPa to 3 GPa so far. In the structure according to the present embodiment, when the first stress liner 6a has a compression stress of 3 GPa (shown in the graph b of FIG. 18), a compression stress of approximately 100 MPa can be applied to each channel in the channel length direction. Even a compression stress as small as 100 MPa can significantly contribute to the increase in the career mobility in each channel of the pFETs.

Furthermore, considering the fact that silicon nitride having a larger and larger stress has been developed, it can be expected that an insulating layer having a still larger compression stress will be developed in the future. When such a material is used as the material of the first stress liner 6a covering the recessed portions 15 in the present embodiment, each channel stress will further be increased as shown in the simulation results of FIG. 18. Accordingly, it can be expected that the career mobility in the pFETs will further be improved.

Fourth Embodiment

Figure 19:
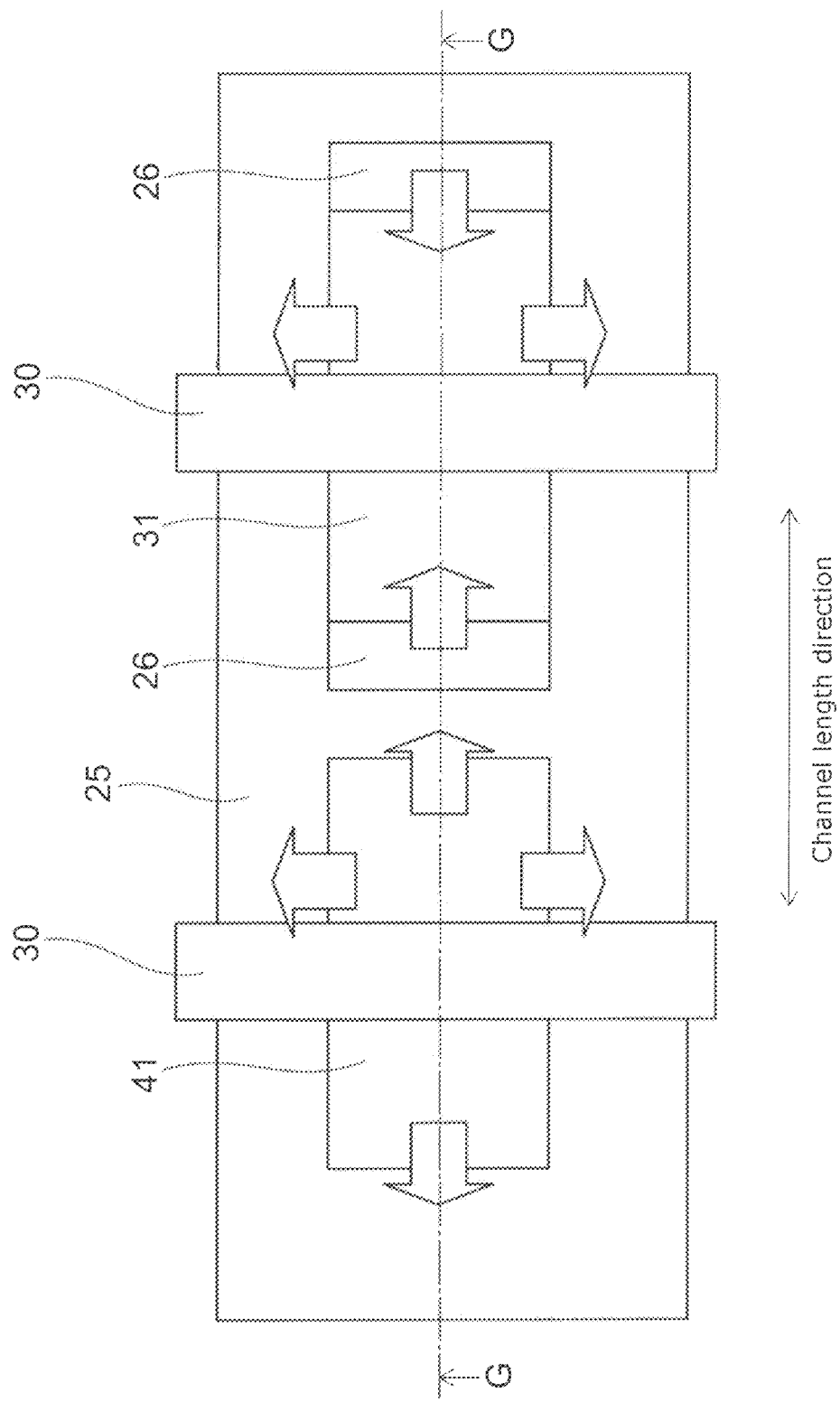
FIG. 19 is a schematic view showing a planar layout of the main portion of a semiconductor device according to a fourth embodiment.

FIG. 19 is a schematic view showing a planar layout of the main portion of a semiconductor device according to a fourth embodiment of the present invention FIG. 20 is a cross-sectional view taken along line G-G in FIG. 19.

The semiconductor device according to the present embodiment also includes a pFET and an nFET formed on a single semiconductor substrate.

The pFET has a p-channel semiconductor active region 31 in which holes contribute to current conduction. The p-channel semiconductor active region 31 has a structure in which p-type source/p-type drain regions 24 are selectively formed in the top surface of an n-type semiconductor region as shown in FIG. 20. A region between the p-type source/p-type drain regions 24 functions as a channel, and, on the region to serve as a channel, a gate electrode 30 is provided with a gate insulating film 29 interposed in between. When a desired control voltage is applied to the gate electrode 30, a p-channel is formed, and thereby induced holes flow through the channel under the gate insulating film 29. Accordingly, the region between the p-type source/p-type drain regions 24 conducts, so that current flows therethrough.

The nFET has an n-channel semiconductor active region 41 in which electrons contribute to current conduction. The n-channel semiconductor active region 41 has a structure in which n-type source/n-type drain regions 23 are selectively formed in the top surface of a p-type semiconductor region. A region between the n-type source/n-type drain regions 23 functions as a channel, and, on the region to serve as a channel, a gate electrode 30 is provided with a gate insulating film 29 interposed in between, as similar to the pFET. In the nFET, when a desired control voltage is applied to the gate electrode 30, an n-channel is formed, and thereby induced electrons flow through the channel under the gate insulating film 29. Accordingly, the region between the n-type source/n-type drain regions 23 conducts, so that current flows therethrough.

The p-channel semiconductor active region 31 and the n-channel semiconductor active region 41 are placed on the semiconductor substrate in a manner that their channel length directions extend approximately parallel to each other. The p-channel semiconductor active region 31 and the n-channel semiconductor active region 41 are provided adjacent to each other in the channel length direction while an element isolation insulating layer 25 having an STI structure and an insulating layer 26 embedded in the element isolation insulating layer 25 lie therebetween.

The gate electrodes 30 respectively extend over the p-channel semiconductor active region 31 and the n-channel semiconductor active region 41, in a direction approximately perpendicular to the channel length directions of the semiconductor active regions. A sidewall insulating layer 27 is provided on each of the side surfaces of the gate electrodes 30.

On both ends, in the channel length direction, of the p-channel semiconductor active region 31, the insulating layers 26 made of a material different from that of the element isolation insulating layer 25 are provided. The insulating layers 26 are embedded in the element isolation insulating layer 25 lying between the p-channel semiconductor active region 31 and the n-channel semiconductor active region 41.

The insulating layers 26 are respectively in contact with the both end surfaces, in the channel length direction, of the p-channel semiconductor active region 31. Here, the end surfaces extend approximately perpendicular to the channel length direction. Each of the insulating layers 26 has a width in the channel width direction (direction approximately vertical to the channel length direction) approximately as large as the p-channel semiconductor active region 31.

The element isolation insulating layer 25, which is made of an insulating material such as silicon oxide or NSG, has an isotropic tensile stress.

The insulating layers 26 are made of a material having a larger compression stress to silicon than the element isolation insulating layer 25 when measured at room temperature, and apply a compression stress in the channel length direction to channel of the p-channel semiconductor active region 31. For example, the insulating layers 26 having the above function may be made of a material (such as silicon nitride) having a smaller thermal expansion coefficient than silicon oxide and NSG consisting the element isolation insulating layer 25.

Each insulating layer 26 can be made to have any one of tensile and compression stresses with a desired magnitude by adjusting the thickness of the insulating layer 26 and process conditions for forming the insulating layer 26, such as temperature, pressure, and a kind and a flow rate of a gas to be used.

Figure 23:
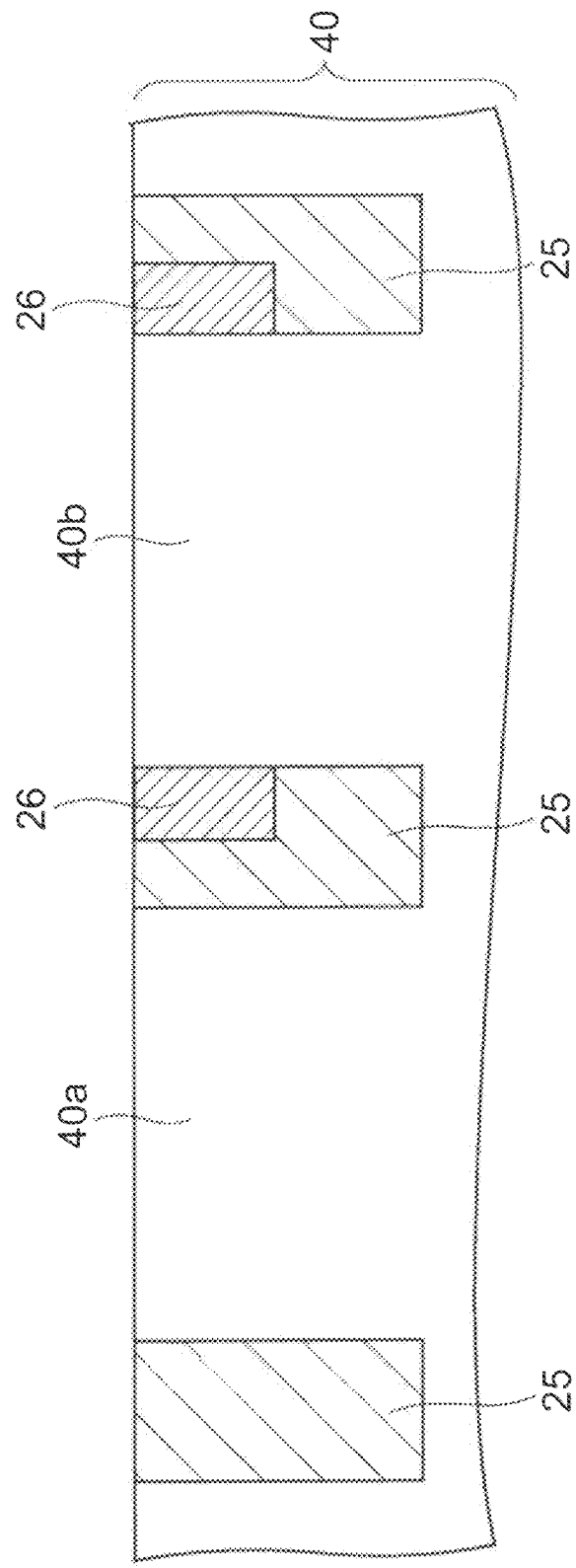

FIGS. 21 to 23 are process cross-sectional views for illustrating an example of a method of forming the insulating layers 26.

Firstly, as shown in FIG. 21A, a trench T is formed in a semiconductor layer (semiconductor substrate) 40 which is made of, for example, silicon. Thereafter, the trench T is filled with the element isolation insulating layer 25 made of, for example, silicon oxide, and having a tensile stress, and the surface thereof is planarized by a CMP method. The element isolation insulating layer 25 thus embedded in the semiconductor layer 40 dielectrically isolates two regions 40a and 40b of a surface layer of the semiconductor layer 40. After later processes including impurity implantation, the regions 40a and 40b become the n-channel semiconductor active region 41 and the p-channel semiconductor active region 31, respectively.

Thereafter, as shown in FIG. 21B, a mask 33 is formed on the top surface of the semiconductor layer 40 and the element isolation insulating layer 25. Specifically, the mask 33 is formed by, for example, the following method. Firstly, a silicon nitride film to serve as the mask 33 is formed on the entire top surface of the semiconductor layer 40 and the element isolation insulating layer 25 by a chemical vapor deposition (CVD) method. Then, openings 34 are selectively formed in the silicon nitride film by a reactive ion etching (RIE) method.

Then, the portions, respectively exposed from the openings 34, of the element isolation insulating layer 25 are selectively removed by etching using a RIE method, so that recessed portions 35 are formed in the element isolation insulating layer 25 as shown in FIG. 22A. The width of each recessed portion 35 is approximately a half of the width of the element isolation insulating layer 25, and the depth of each recessed portion 35 from the top surface of the element isolation insulating layer 25 is set to be not more than a half of the depth of the element isolation insulating layer 25. Thereby, the aspect ratio of each recessed portion 35 can be set to be nearly equal to or smaller than that of the trench T in which the element isolation insulating layer 25 is filled. Accordingly, with this method as well, the filling quality of the recessed portions 35 with the insulating layers 26 is good.

Subsequently, as shown in FIG. 22B, the recessed portions 35 are respectively filled with the insulating layers 26 each having a compression stress, and portions, stacked higher than the mask 33, of the insulating layers 26 are ground away by a CMP method. Thereby, the top surfaces of the mask 33 and the insulating layers 26 are planarized.

Then, the mask 33 and portions, stacked higher than the element isolation insulating layer 25 in the openings of the mask 33, of the insulating layer 26 are removed by etching. Both the mask 33 and the portions of the insulating layers 26 can be removed by, for example, isotropic wet etching. After this process, the structure shown in FIG. 23 is obtained.

In general, applying a tensile stress to the channel of an nFET in the both channel length and width directions improves the career (electron) mobility in the nFET, thus improving its performance as a transistor. In the present embodiment, the n-channel semiconductor active region 41 is surrounded by only the element isolation insulating layer 25 having an isotropic tensile stress, so that an isotropic tensile stress is applied to the channel of the n-channel semiconductor active region 41 as indicated by outline arrows in FIG. 19. In other words, a tensile stress is applied to the n-channel semiconductor active region 41 in the both channel length and width directions. As a result, the career mobility is improved in the n-channel, so that its performance as a transistor can be increased.

By contrast, in a pFET, it is desirable to apply, to the channel, a compression stress and a tensile stress in the channel length direction and in the channel width direction, respectively, in order to improve the career (hole) mobility. However, if the p-channel semiconductor active region 31 is simply surrounded by a type of an element isolation insulating layer having an isotropic tensile or a compression stress, a tensile or compression stress is applied in both the channel length and width directions. In other words, appropriate stresses for the p-channel semiconductor active region 31, which are a compression stress in the channel length direction and a tensile stress in the channel width direction, cannot be applied to the p-channel semiconductor active region 31.

Thus, in the present embodiment, the portions of the element isolation insulating layer 25 having an isotropic tensile stress, i.e. the portions in contact with both end surfaces, in the channel length direction, of the p-channel semiconductor active region 31 are selectively removed. Then, the recessed portions formed by the removal are filled with the insulating layers 26 each having a compression stress so that a compression stress can be selectively applied to the p-channel semiconductor active region 31 in only the channel length direction.

The p-channel semiconductor active region 31 is surrounded by: the insulating layers 26, which are in contact with both ends, in the channel length direction, of the p-channel semiconductor active region 31; and the element isolation insulating layer 25, which is in contact with the side surfaces, approximately parallel to the channel length direction, of the p-channel semiconductor active region 31. In this structure, since the element isolation insulating layer 25 has a tensile stress, a tensile stress in the channel width direction can be applied to the channel of the p-channel semiconductor active region 31.

The n-channel semiconductor active region 41, which is surrounded by only the element isolation insulating layer 25, is not in contact with any of the insulating layers 26 each having a compression stress. Accordingly, in the n-channel semiconductor active region 41, no compression stress is applied to the channel. Thus, the career (electron) mobility improved by the tensile stress of the element isolation insulating layer 25 is not impeded.

As described above, according to the present embodiment, a stress appropriate for a pFET is applied to a pFET while a stress appropriate for an nFET is applied to an nFET, in a semiconductor device in which a pFET and an nFET are formed on a single semiconductor substrate (in a single chip). This improves the career mobility in both of the transistors, thus increasing the performance of the entire semiconductor device.

In the present embodiment as well as in the aforementioned first to third embodiments, a first stress liner having an isotropic compression stress may be provided to cover the pFET, while a second stress liner having an isotropic tensile stress may be provided to cover the nFET so that the stress liners can apply the stresses to the channel, thereby further improving the career mobility in both of the transistors. In this case, the element isolation insulating layer 25 may have any kind and magnitude of stress in accordance with the process conditions, and may be made of a material having substantially no stress.

Fifth Embodiment

Figure 24:
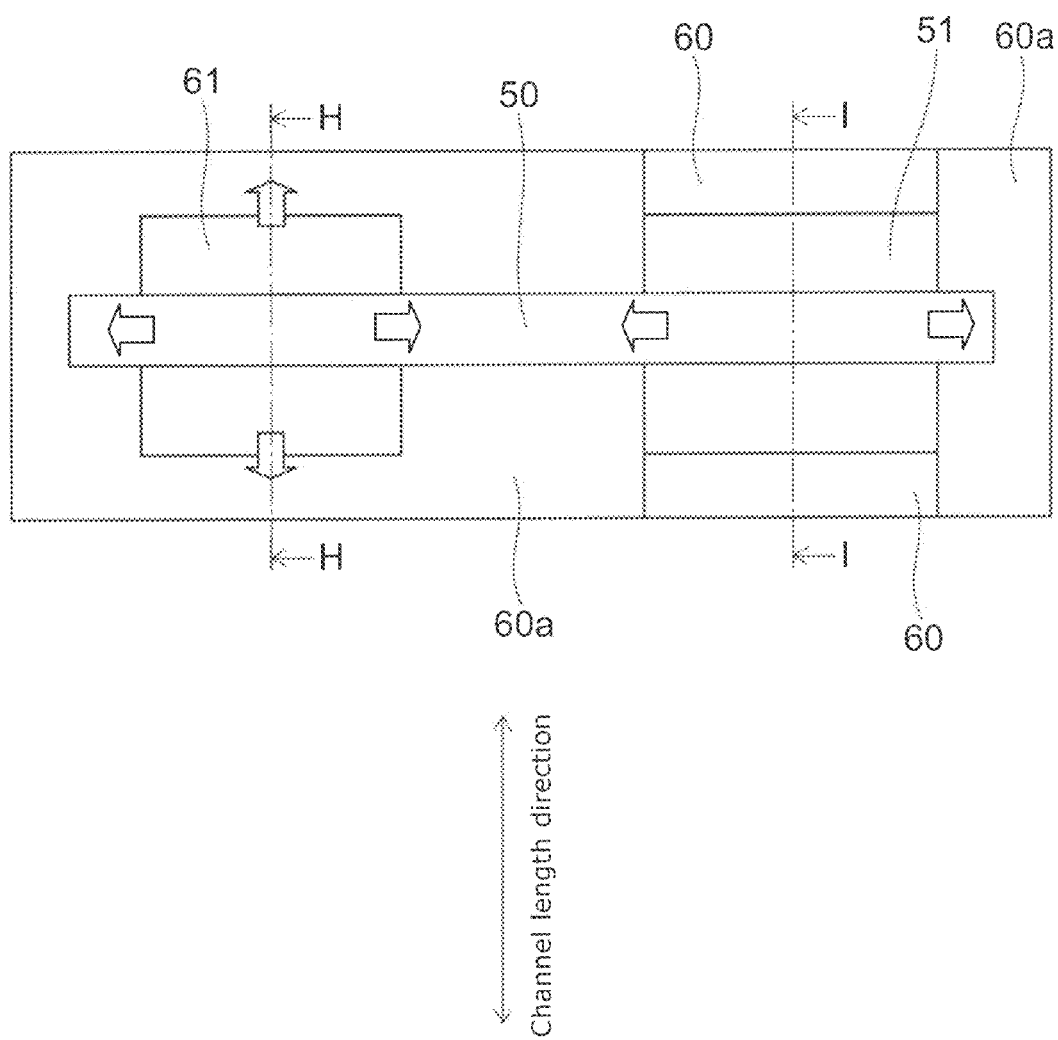
FIG. 24 is a schematic view showing a planar layout of the main portion of a semiconductor device according to a fifth embodiment.

FIG. 24 is a schematic view showing a planar layout of the main portion of a semiconductor device according to a fifth embodiment of the present invention.

Figure 25:
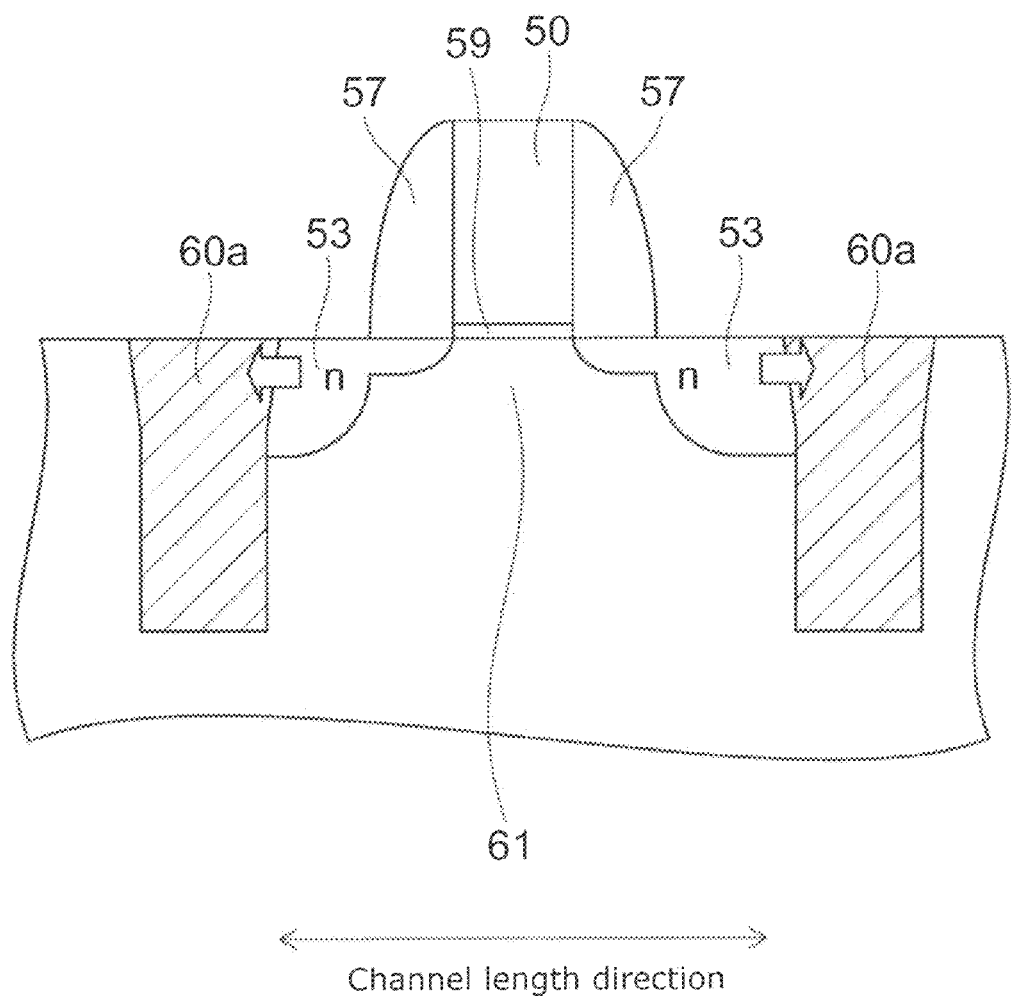
FIG. 25 is a cross-sectional view taken along line H-H in FIG. 24, and shows an nFET.

FIG. 25 is a cross-sectional view taken along line H-H in FIG. 24, and shows an nFET.

Figure 26:
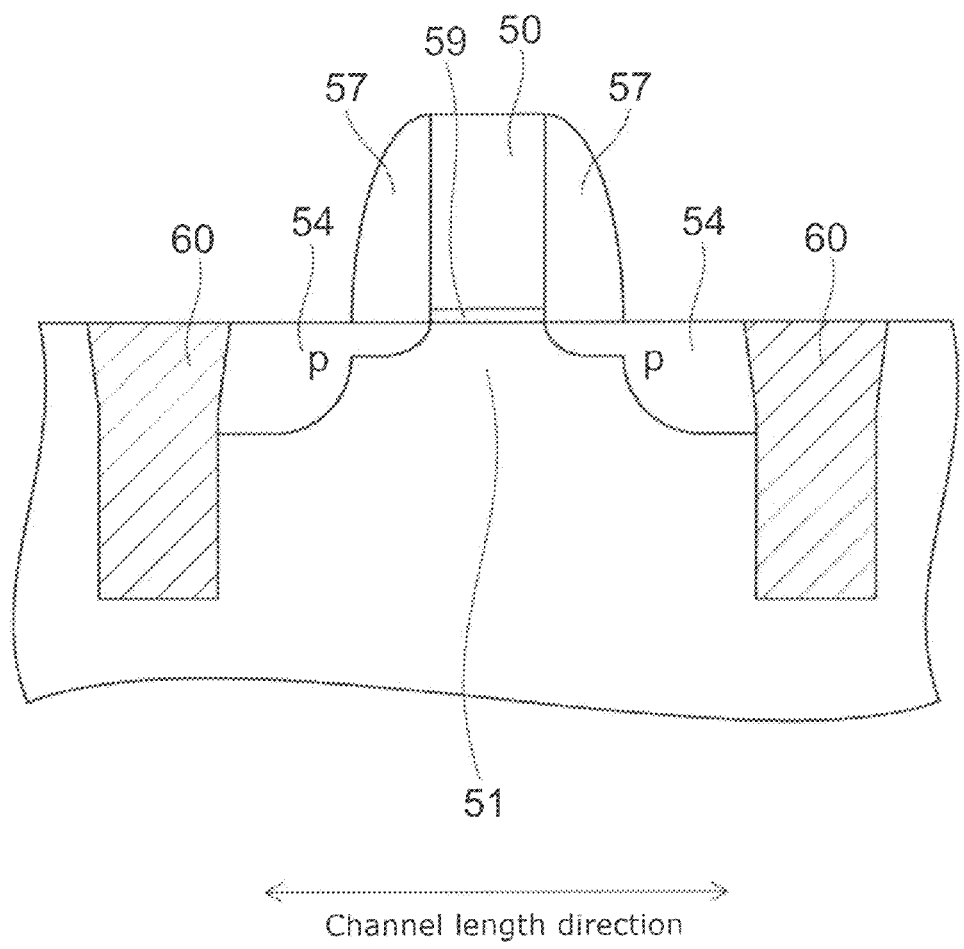
FIG. 26 is a cross-sectional view taken along line I-I in FIG. 24, and shows a pFET.

FIG. 26 is a cross-sectional view taken along line I-I in FIG. 24, and shows a pFET.

The semiconductor device according to the present embodiment also includes the pFET and the nFET formed on a single semiconductor substrate.

As shown in FIG. 25, the nFET has an n-channel semiconductor active region 61 in which electrons contribute to current conduction. The n-channel semiconductor active region 61 has a structure in which n-type source/n-type drain regions 53 are selectively formed in the top surface of a p-type semiconductor region. A region between the n-type source/n-type drain regions 53 functions as a channel, and, on the region to serve as a channel, a gate electrode 50 is provided with a gate insulating film 59 interposed in between. In the nFET, when a desired control voltage is applied to the gate electrode 50, an n-channel is formed, and thereby induced electrons flow through the channel under the gate insulating film 59. Accordingly, the region between the n-type source/n-type drain regions 53 conducts, so that current flows therethrough.

As shown in FIG. 26, the pFET has a p-channel semiconductor active region 51 in which holes contribute to current conduction. The p-channel semiconductor active region 51 has a structure in which p-type source/p-type drain regions 54 are selectively formed in the top surface of an n-type semiconductor region. A region between the p-type source/p-type drain regions 54 functions as a channel, and, on the region to serve as a channel, the gate electrode 50 is provided with the gate insulating film 59 interposed in between. When a desired control voltage is applied to the gate electrode 50, a p-channel is formed, and thereby induced holes flow through the channel under the gate insulating film 59. Accordingly, the region between the p-type source/p-type drain regions 54 conducts, so that current flows therethrough.

As shown in FIG. 24, p-channel semiconductor active region 51 and the n-channel semiconductor active region 61 are placed on the semiconductor substrate in a manner that their channel length directions extend approximately parallel to each other. The p-channel semiconductor active region 51 and the n-channel semiconductor active region 61 are provided adjacent to each other in the channel width direction (extending direction of the gate electrode 50) while an element isolation insulating layer 60a having an STI structure lies therebetween.

The gate electrode 50 extends over the p-channel semiconductor active region 31 and the n-channel semiconductor active region 41, in a direction approximately perpendicular to the channel length directions of the semiconductor active regions. A sidewall insulating layer 57 is provided on each of the side surfaces of the gate electrode 50.

The n-channel semiconductor active region 61 is surrounded by only the element isolation insulating layer 60a. In contact with both ends, in the channel length direction, of the p-channel semiconductor active region 51, element isolation insulating layers 60 are provided.

The element isolation insulating layers 60a and 60 are made of the same insulation material such as silicon nitride. The element isolation insulating layers 60a and 60 are different from each other in that the element isolation insulating layers 60a are irradiated with ultraviolet light to have an isotropic tensile stress while the element isolation insulating layers 60 are not irradiated with ultraviolet light to have substantially no stress.

The element isolation insulating layers 60a have substantially no stress in an initial condition before being irradiated with ultraviolet light. In other words, the element isolation insulating layers 60a have no stress to affect the career mobility of a channel in an initial condition before being irradiated with ultraviolet light, but is made to shift from the initial condition to having an isotropic tensile stress by the ultraviolet light irradiation. Accordingly, the n-channel semiconductor active region 61 is surrounded by only the element isolation insulating layer 60a having an isotropic tensile stress.

In contrast, the element isolation insulating layers 60 in contact with both ends, in the channel length direction, of the p-channel semiconductor active region 51 are not irradiated with ultraviolet light, and thus remain in an initial condition, i.e. remain to have substantially no stress.

Figure 27:
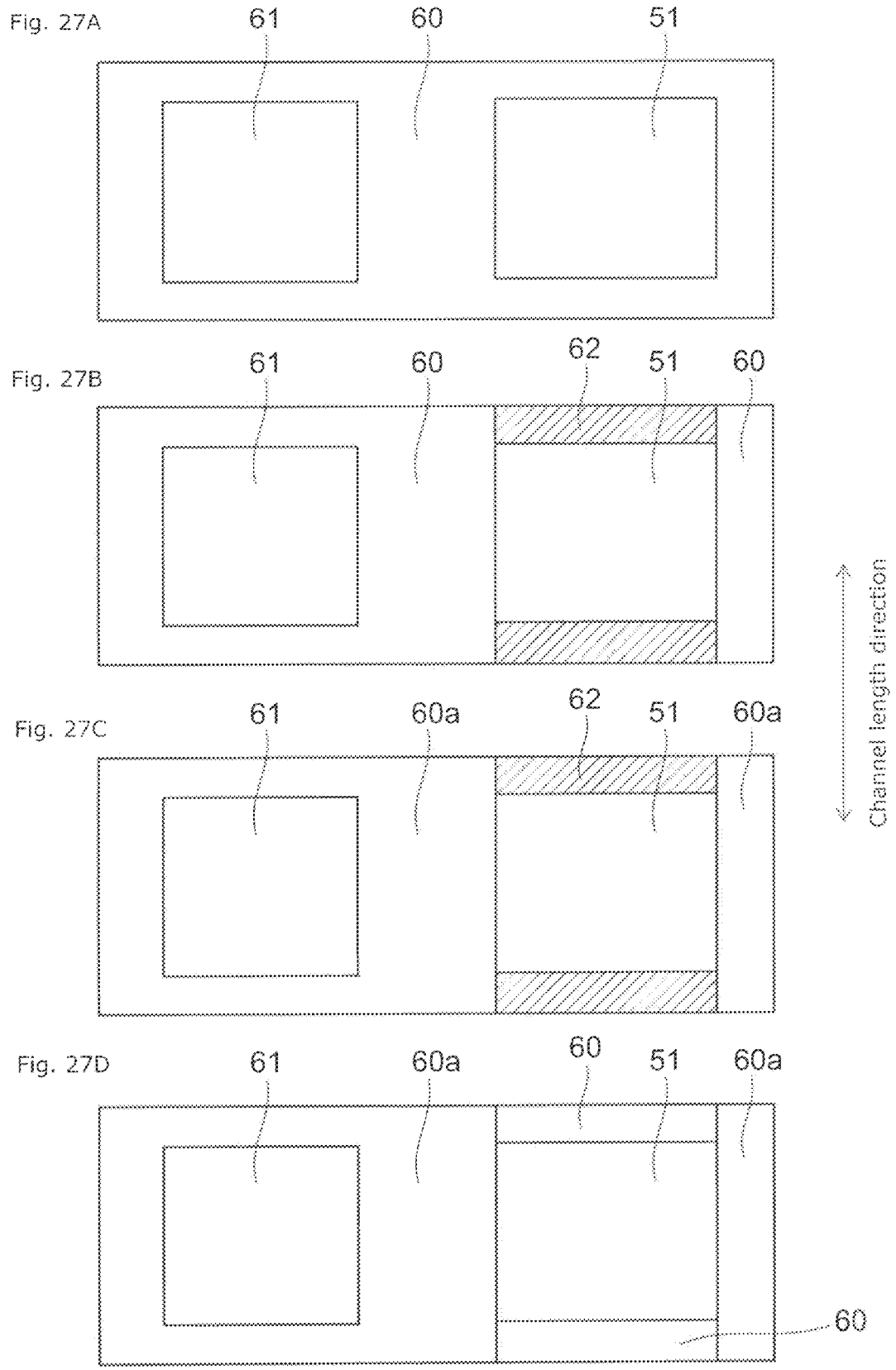
FIG. 27 shows a method of selectively irradiating the element isolation insulating layers with ultraviolet light.

FIG. 27 shows a method of selectively irradiating the element isolation insulating layers with ultraviolet light.

Firstly, as shown in FIG. 27A, a semiconductor layer (semiconductor substrate) is etched so as to left portions to be the n-channel semiconductor active region 61 and the p-channel semiconductor active region 51, and thereby a trench is formed in the semiconductor layer. Thereafter, the trench is filled with the element isolation insulating layer 60 in an initial condition before being irradiated with ultraviolet light and thus having substantially no stress. Here, the n-channel semiconductor active region 61 and the p-channel semiconductor active region 51 are surrounded by only the element isolation insulating layer 60.

Then, a silicon oxide film or the like is stacked on the entire top surfaces of the n-channel semiconductor active region 61, the p-channel semiconductor active region 51 and the element isolation insulating layer 60. Thereafter, the silicon oxide film partially removed through lithography and etching processes such that only portions (portions outside the both ends) in contact with the both ends, in the channel length direction, of the p-channel semiconductor active region 51 can remain as shown in FIG. 27B. Thereby, a mask 62 is formed. Alternatively, only the portions (portions outside the both ends) in contact with the both ends, in the channel length direction, of the p-channel semiconductor active region 51 may be covered with a reticle that is to serve as the mask 62.

Then, ultraviolet light irradiation is performed. The portions, not covered with the mask 62, of the element isolation insulating layer 60 are irradiated with ultraviolet light, thus changed in quality to become the element isolation insulating layers 60a having an isotropic tensile stress as shown in FIG. 27C from an initial condition in which they have substantially no stress.

Then, the mask 62 made of a silicon oxide film or a reticle is removed through, for example, a wet process. Thereby, the structure shown in FIG. 27B is obtained. Here, the portions covered with the mask 62 (portions in contact with the both ends, in the channel length direction, of the p-channel semiconductor active region 51) is not irradiated with ultraviolet light, thus remaining in an initial condition in which they have substantially no stress.

Depending on the alignment accuracy of the mask 62, the portions outside the both ends, in the channel width direction of the p-channel semiconductor active region 51, may possibly be partially covered with the mask 62, so that the portions unintentionally covered with the mask 62 is not irradiated with ultraviolet light, thereby remaining in an initial condition in which they have substantially no stress. However, even in this case, the width of each portion unintentionally covered with the mask 62 is as small as approximately 5% of the width, in the channel width direction, of the p-channel semiconductor active region 51. Even when the portions, having such a width, of the element isolation insulating layer remain in an initial condition at any of the both ends, in the channel width direction, of the p-channel semiconductor active region 51, these ends are substantially surrounded by the element isolation insulating layer 60 irradiated with ultraviolet light to have a tensile stress. The tensile stress of the element isolation insulating layers 60 acts in the channel width direction in the p-channel semiconductor active region 51.

In general, applying a tensile stress to the channel of an nFET in the both channel length and width directions improves the career (electron) mobility in the nFET, thus improving its performance as a transistor. In the present embodiment, the n-channel semiconductor active region 61 is surrounded by only the element isolation insulating layer 60a irradiated with ultraviolet light to have a tensile stress, so that an isotropic tensile stress is applied to the channel of the n-channel semiconductor active region 61 as indicated by outline arrows in FIG. 24. In other words, a tensile stress is applied to the n-channel semiconductor active region 61 in the both channel length and width directions. As a result, the career mobility is improved in the n-channel, so that its performance as a transistor can be increased.

As described above, an isotropic tensile stress is effective for the increase in the career mobility in an nFET while, in a pFET, a tensile stress applied in the channel width direction contributes to the increase in the career mobility but a tensile stress applied in the channel length direction diminishes the career mobility. In other words, in the p-channel semiconductor active region 51, it is required that a tensile stress be applied in only the channel width direction, and not applied in the channel length direction.

Thus, in the present embodiment as described above, ultraviolet light irradiation is selectively performed on the element isolation insulating layer surrounding the p-channel semiconductor active region 51 and the n-channel semiconductor active region 61. Accordingly, in the element isolation insulating layer, the portions 60 in contact with both ends, in the channel length direction, of the p-channel semiconductor active region 51 remain to have substantially no stress, and the other portions 60a are made to have a tensile stress.

The p-channel semiconductor active region 51 is surrounded by: the element isolation insulating layers 60, which are in contact with both ends, in the channel length direction, of the p-channel semiconductor active region 51; and the element isolation insulating layers 60a, which are in contact with the side surfaces, approximately parallel to the channel length direction, of the p-channel semiconductor active region 51. The element isolation insulating layers 60a have a tensile stress, and can thus apply a tensile stress to the channel of the p-channel semiconductor active region 51 in the channel width direction, thereby increasing the career mobility in the pFET. The element isolation insulating layer 60 have substantially no stress, and thus does not apply a tensile stress to the channel of the p-channel semiconductor active region 51 in the channel length direction, thereby not diminishing the career mobility in the pFET.

In the n-channel semiconductor active region 61, which is surrounded by only the element isolation insulating layer 60a, a tensile stress takes effect in both the channel length and width directions. Accordingly, the career mobility can be improved in the nFET.

As described above, according to the present embodiment, a stress appropriate for a pFET is applied to a pFET while a stress appropriate for an nFET is applied to an nFET, in a semiconductor device in which a pFET and an nFET are formed on a single semiconductor substrate (in a single chip). This improves the career mobility in both of the transistors, thus increasing the performance of the entire semiconductor device.

Sixth Embodiment

Figure 28:
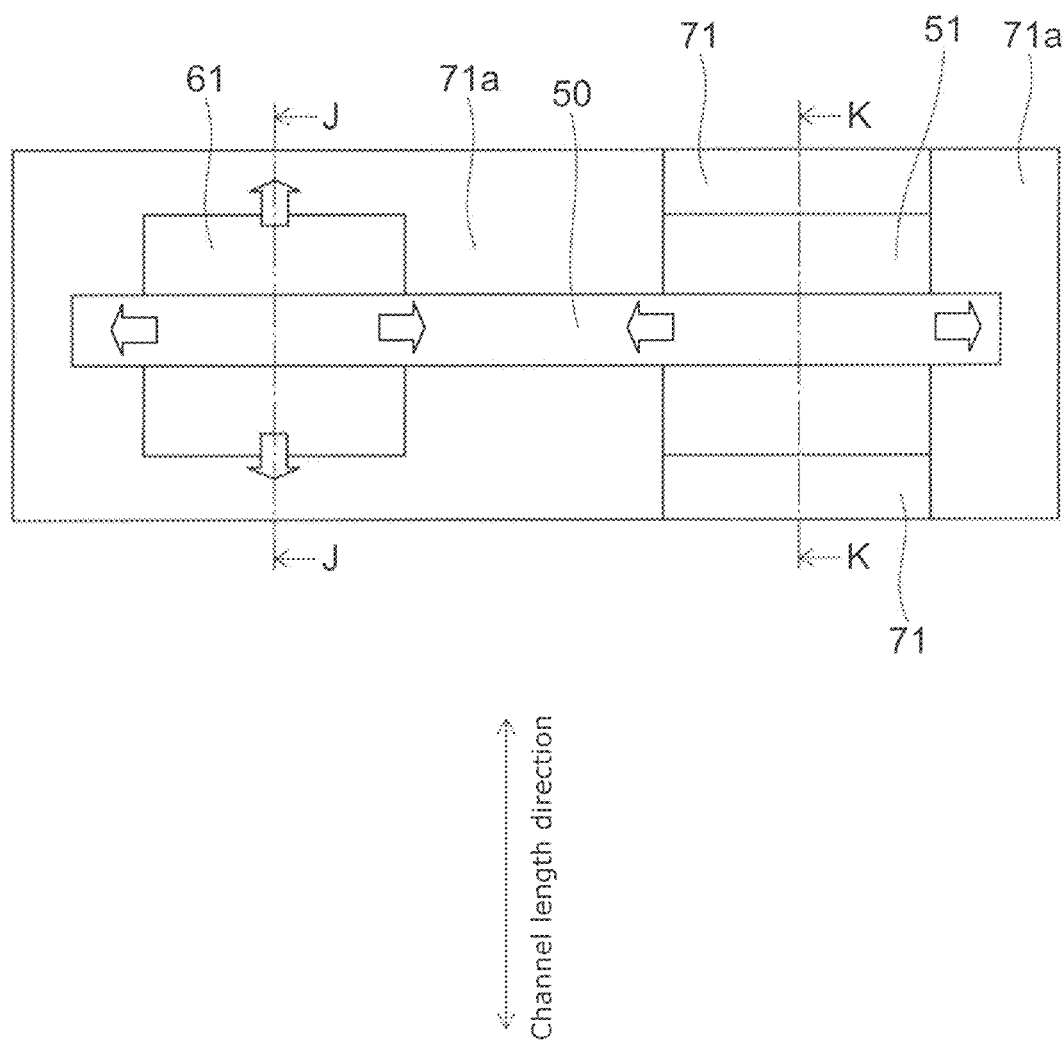
FIG. 28 is a schematic view showing a planar layout of the main portion of a semiconductor device according to a sixth embodiment.

FIG. 28 is a schematic view showing a planar layout of the main portion of a semiconductor device according to a sixth embodiment of the present invention.

Figure 29:
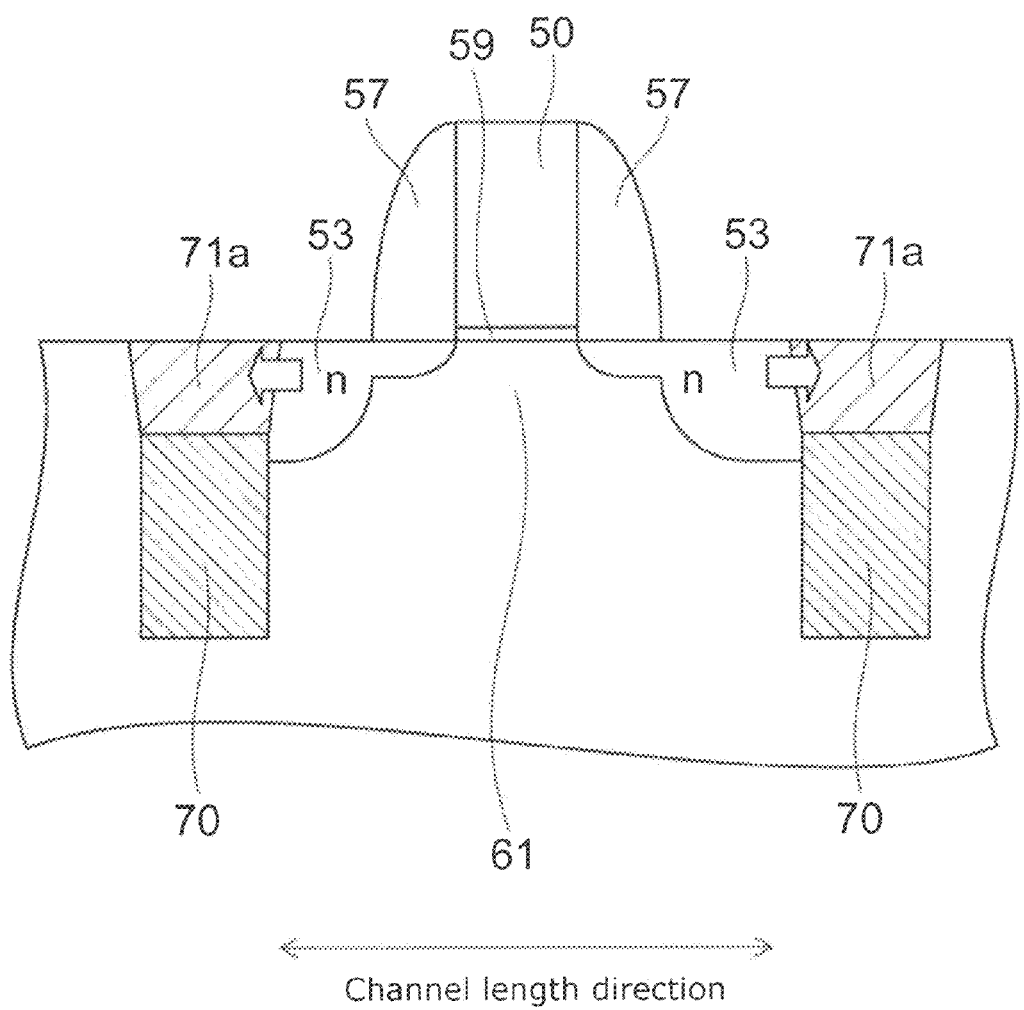
FIG. 29 is a cross-sectional view taken along line J-J in FIG. 28, and shows an nFET.

FIG. 29 is a cross-sectional view taken along line J-J in FIG. 28, and shows an nFET.

Figure 30:
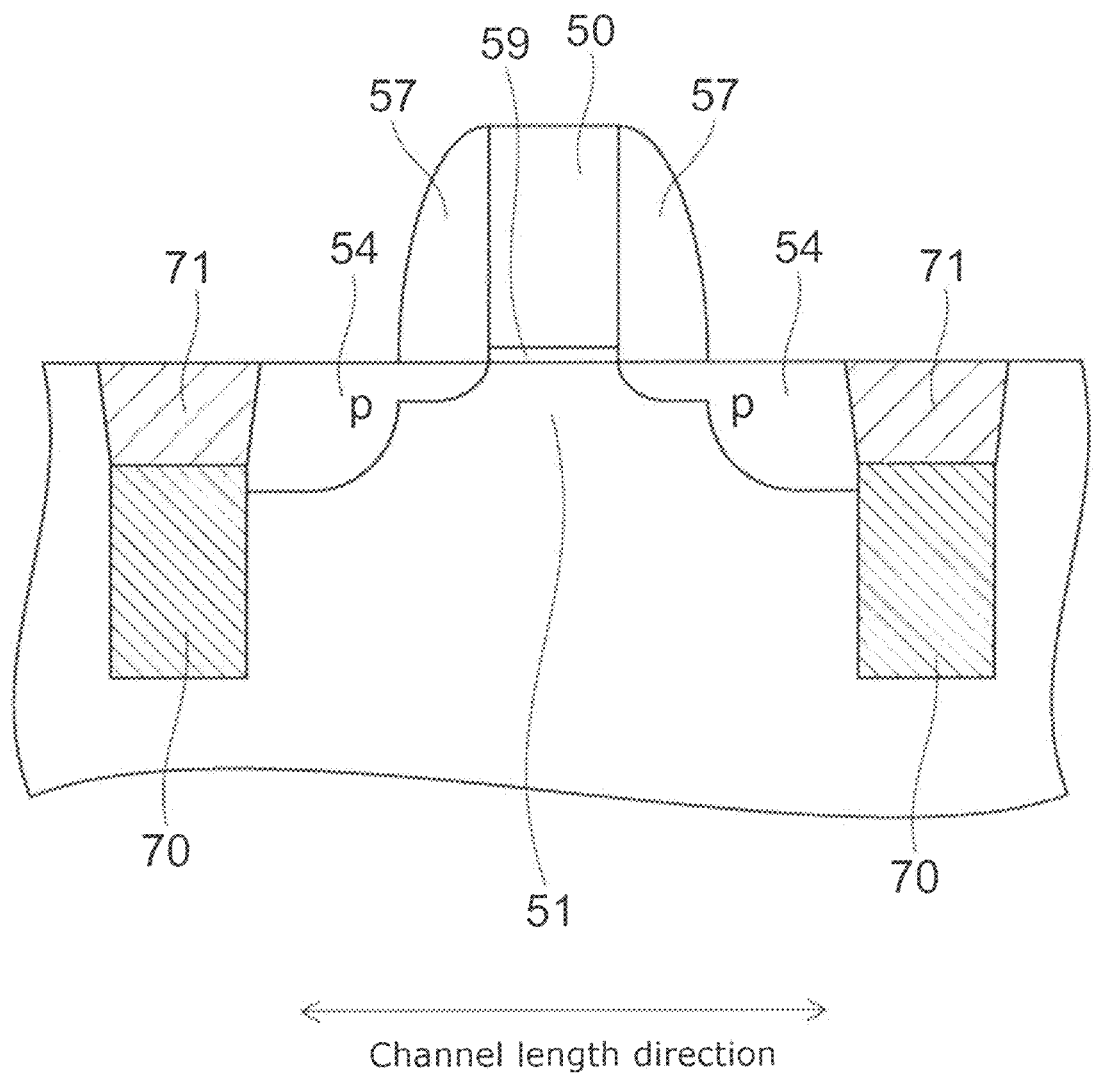
FIG. 30 is a cross-sectional view taken along line K-K in FIG. 28, and shows a pFET.

FIG. 30 is a cross-sectional view taken along line K-K in FIG. 28, and shows a pFET.

In the semiconductor device according to the present embodiment, as in the aforementioned fifth embodiment, ultraviolet light irradiation is selectively performed on an element isolation insulating layer, so that, in the element isolation insulating layer, portions 71 in contact with both ends, in the channel length direction, of a p-channel semiconductor active region 51 remain to have substantially no stress, and the other portions 71a are made to have a tensile stress.

In the present embodiment, the element isolation insulating layer has a layered structure including layers made of different materials in consideration of the filling quality of a trench with the element isolation insulating layer.

As shown in FIGS. 29 and 30, a trench having a depth of several hundreds nm is firstly filled with an element isolation insulating layer 70 made of a material having a relatively good filling property, such as silicon oxide, up to the depth of approximately 60 nm. Then, the trench having the remaining depth of approximately 60 nm is filled with an element isolation insulating layer 71 made of a material likely to provide a relatively large stress, such as silicon nitride. The element isolation insulating layers 70 and 71 have substantially no stress in an initial condition before being irradiated with ultraviolet light.

Then, as in the fifth embodiment, the element isolation insulating layer 71 is irradiated with ultraviolet light, with only the portions outside the both ends, in the channel length direction, of the p-channel semiconductor active region 51 covered with a mask.

Thus, the portions covered with the mask are not irradiated with ultraviolet light, thus remaining in an initial condition, i.e., remaining to have substantially no stress. The other portions are irradiated with ultraviolet light, and thus changed in quality to become to the element isolation insulating layer 71a having an isotropic tensile stress from the initial condition. The lower element separation insulation layer 70 is not irradiate with ultraviolet light, and thus remains to have substantially no stress.

The element isolation insulating layers 71a made to have a tensile stress surround portions (source/drain regions, channels) substantially contributing to current conduction, of a surface layer in the semiconductor layer, and can apply a tensile stress to the channels.

The p-channel semiconductor active region 51 is surrounded by: the element isolation insulating layers 71, which cover both ends, in the channel length direction, of the p-channel semiconductor active region 51; and the element isolation insulating layers 71a, which cover the side surfaces, approximately parallel to the channel length direction, of the p-channel semiconductor active region 51. The element isolation insulating layers 71a have a tensile stress, and can thus apply a tensile stress to the channel of the p-channel semiconductor active region 51 in the channel width direction, thereby increasing the career mobility in the pFET. The element isolation insulating layers 71 have substantially no stress, and thus do not apply a tensile stress to the channel of the p-channel semiconductor active region 51 in the channel length direction, thereby not diminishing the career mobility in the pFET.

In the n-channel semiconductor active region 61, which is surrounded by only the element isolation insulating layer 71a, a tensile stress takes effect in both the channel length and width directions. Accordingly, the career mobility can be improved in the nFET.

As described above, according to the present embodiment as well, a stress appropriate for a pFET is applied to a pFET while a stress appropriate for an nFET is applied to an nFET, in a semiconductor device in which a pFET and an nFET are formed on a single semiconductor substrate (in a single chip). This improves the career mobility in both of the transistors, thus increasing the performance of the entire semiconductor device.

Seventh Embodiment

Figure 31:
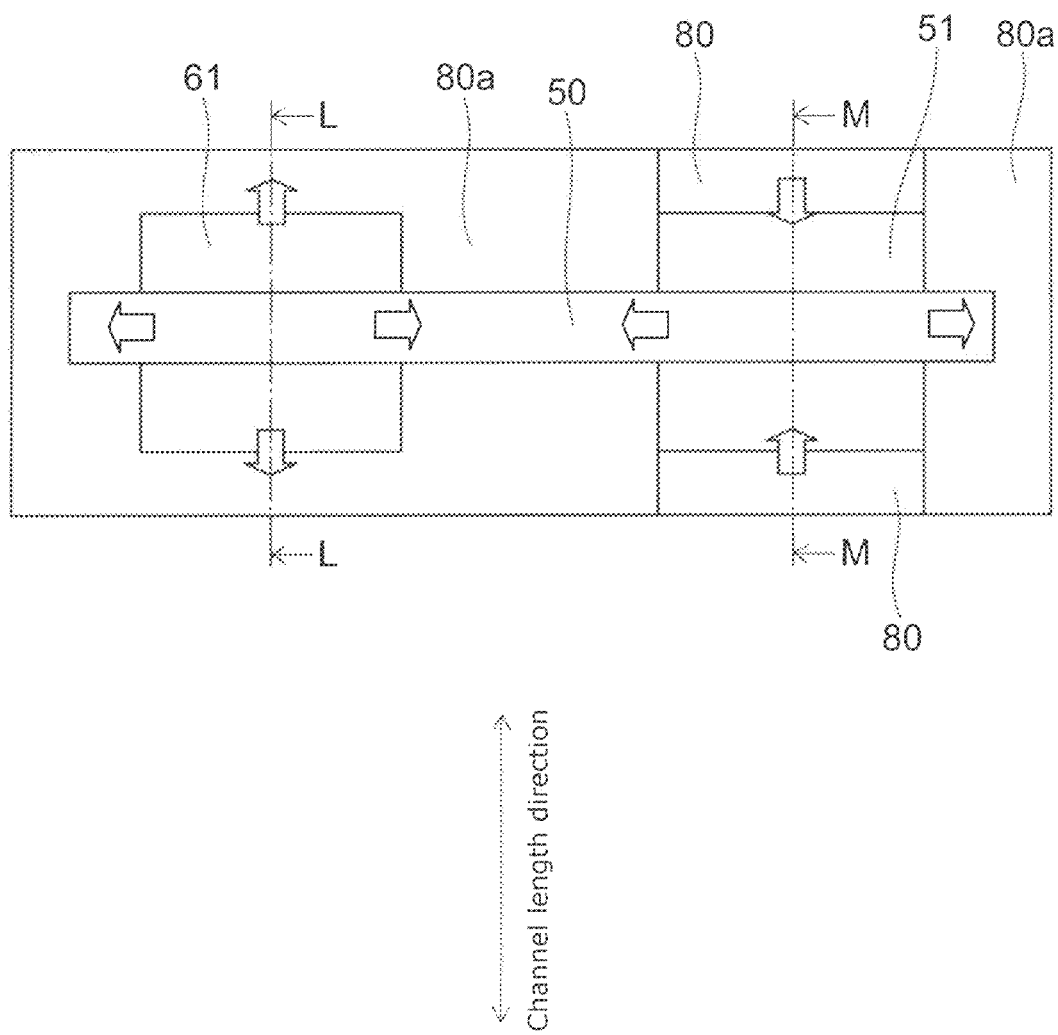
FIG. 31 is a schematic view showing a planar layout of the main portion of a semiconductor device according to a seventh embodiment.

FIG. 31 is a schematic view showing a planar layout of the main portion of a semiconductor device according to a seventh embodiment of the present invention.

Figure 32:
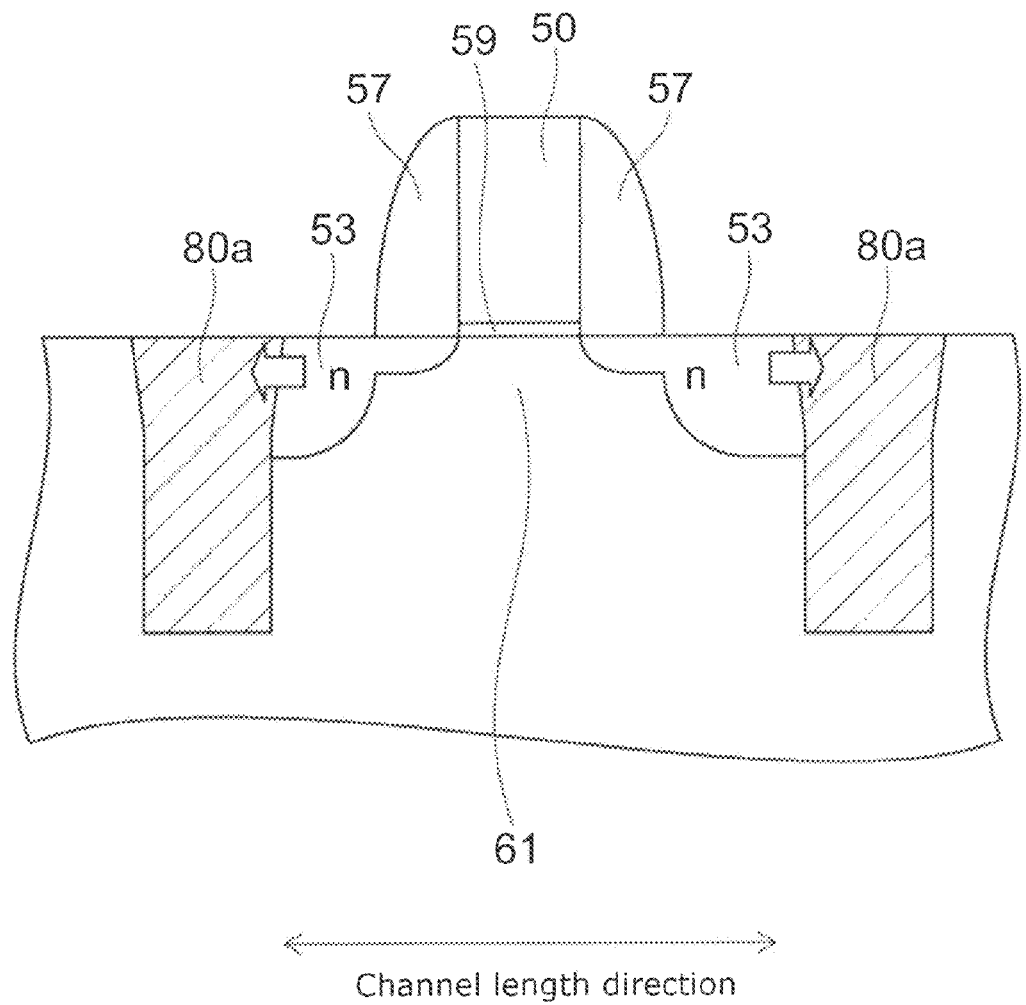
FIG. 32 is a cross-sectional view taken along line L-L in FIG. 31, and shows an nFET.

FIG. 32 is a cross-sectional view taken along line L-L in FIG. 31, and shows an nFET.

Figure 33:
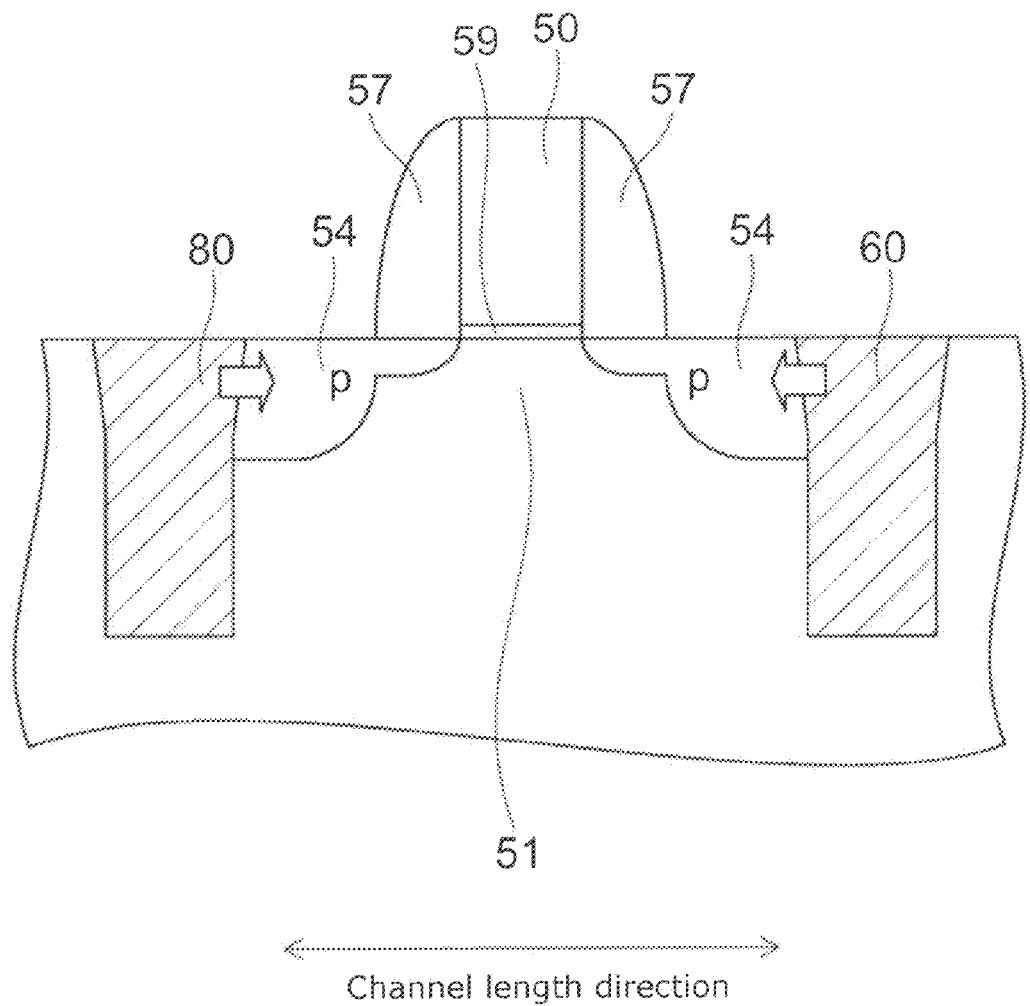
FIG. 33 is a cross-sectional view taken along line M-M in FIG. 31, and shows a pFET.

FIG. 33 is a cross-sectional view taken along line M-M in FIG. 31, and shows a pFET.

In the present embodiment as well as in the fifth embodiment, an element isolation insulating layer is irradiated with ultraviolet light, with only the portions outside the both ends, in the channel length direction, of a p-channel semiconductor active region 51 covered with a mask.

An n-channel semiconductor active region 61 is surrounded by only the element isolation insulating layer 80a. In contact with both ends, in the channel length direction, of the p-channel semiconductor active region 51, element isolation insulating layers 80 are provided.

The element isolation insulating layers 80a and 80 are made of the same insulation material such as silicon nitride. The element isolation insulating layers 80a and 80 are different from each other in that the element isolation insulating layers 80a are irradiated with ultraviolet light to have a tensile stress while the element isolation insulating layers 80 are not irradiated with ultraviolet light to have a compression stress.

The element isolation insulating layers 80a has an isotropic compression stress in an initial condition before being irradiated with ultraviolet light, but is made to shift to having an isotropic tensile stress by the ultraviolet light irradiation. Accordingly, the n-channel semiconductor active region 61 is surrounded by only the element isolation insulating layer 80a having an isotropic tensile stress.

In contrast, the element isolation insulating layers 80 in contact with both ends, in the channel length direction, of the p-channel semiconductor active region 51 are not irradiated with ultraviolet light, and thus remain in an initial condition, i.e. remain to have a compression stress.

In general, applying a tensile stress to the channel of an nFET in the both channel length and width directions improves the career (electron) mobility in the nFET, thus improving its performance as a transistor. In the present embodiment, the n-channel semiconductor active region 61 is surrounded by only the element isolation insulating layer 80a irradiated with ultraviolet light to have a tensile stress, so that an isotropic tensile stress is applied to the channel of the n-channel semiconductor active region 61. In other words, a tensile stress is applied to the n-channel semiconductor active region 61 in the both channel length and width directions. As a result, the career mobility is improved in the n-channel, so that its performance as a transistor can be increased.

As described above, an isotropic tensile stress is effective for the increase in the career mobility in an nFET while, in a pFET, a tensile stress applied in the channel width direction contributes to the increase in the career mobility but a tensile stress applied in the channel length direction diminishes the career mobility. Instead, if a compression stress is applied in the channel length direction, the career mobility is increased. In other words, in the p-channel semiconductor active region 51, it is desirable that a tensile stress and a compression stresses are applied in the channel width direction and the channel length directions, respectively.

Thus, in the present embodiment as described above, ultraviolet light irradiation is selectively performed on the element isolation insulating layer. Thereby, in the element isolation insulating layer, the portions 80 in contact with both ends, in the channel length direction, of the p-channel semiconductor active region 51 are made to have a compression stress, and the other portions 80a are made to have a tensile stress.

The p-channel semiconductor active region 51 is surrounded by: the element isolation insulating layers 80, which cover both ends, in the channel length direction, of the p-channel semiconductor active region 51; and the element isolation insulating layers 80a, which cover the side surfaces, approximately parallel to the channel length direction, of the p-channel semiconductor active region 51. The element isolation insulating layers 80a have a tensile stress, and can thus apply a tensile stress to the channel of the p-channel semiconductor active region 51 in the channel width direction, thereby increasing the career mobility in the pFET. The element isolation insulating layers 80 have a compression stress, and thus apply a compression stress to the channel of the p-channel semiconductor active region 51 in the channel length direction, thereby further increasing the career mobility in the pFET.

In the n-channel semiconductor active region 61, which is surrounded by only the element isolation insulating layer 80a, a tensile stress takes effect in both the channel length and width directions. Accordingly, the career mobility can be improved in the nFET. Moreover, the n-channel semiconductor active region 61 is not in contact with the element isolation insulating layer 80, the compression stress of the element isolation insulating layer 80 is not applied to the channel of the n-channel semiconductor active region 61.

As described above, according to the present embodiment, a stress appropriate for a pFET is applied to a pFET while a stress appropriate for an nFET is applied to an nFET, in a semiconductor device in which a pFET and an nFET are formed on a single semiconductor substrate (in a single chip). This improves the career mobility in both of the transistors, thus increasing the performance of the entire semiconductor device.

Eighth Embodiment

Figure 34:
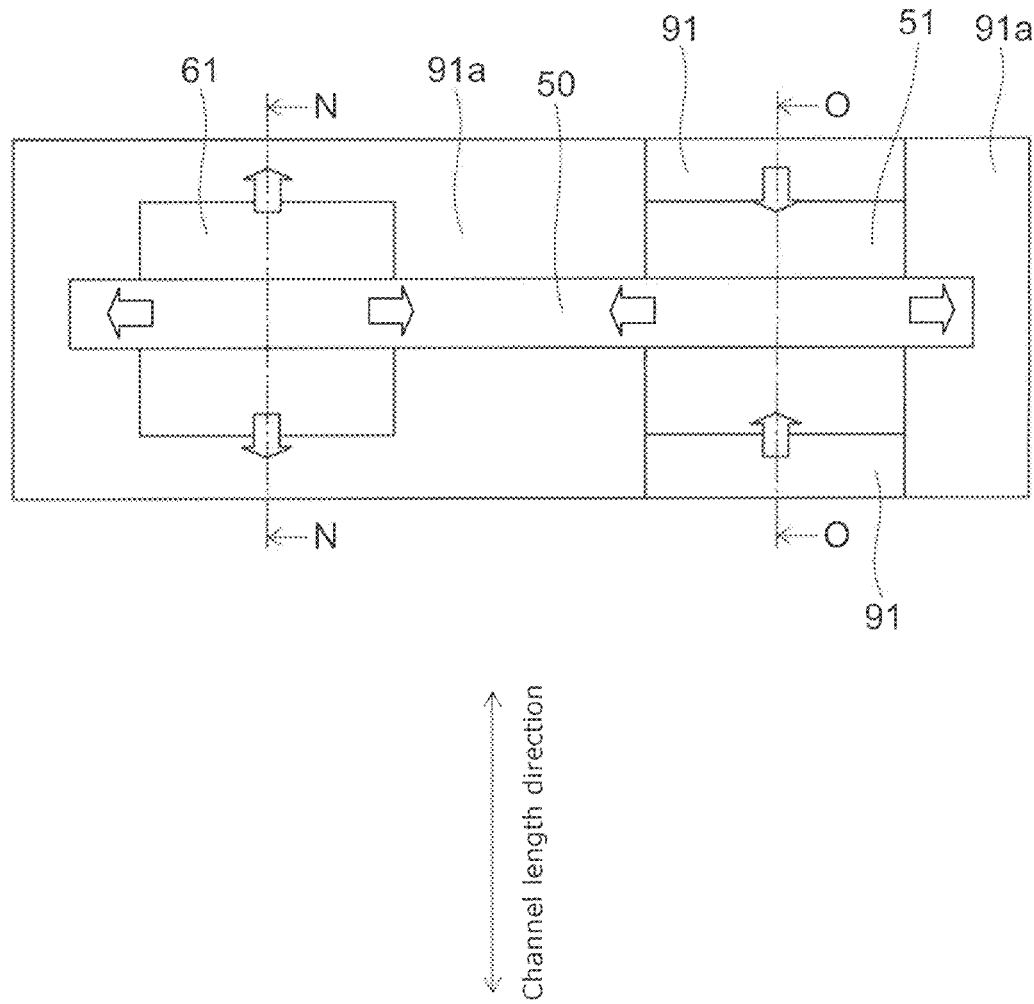
FIG. 34 is a schematic view showing a planar layout of the main portion of a semiconductor device according to the eighth embodiment.

FIG. 34 is a schematic view showing a planar layout of the main portion of a semiconductor device according to the eighth embodiment of the present invention.

Figure 35:
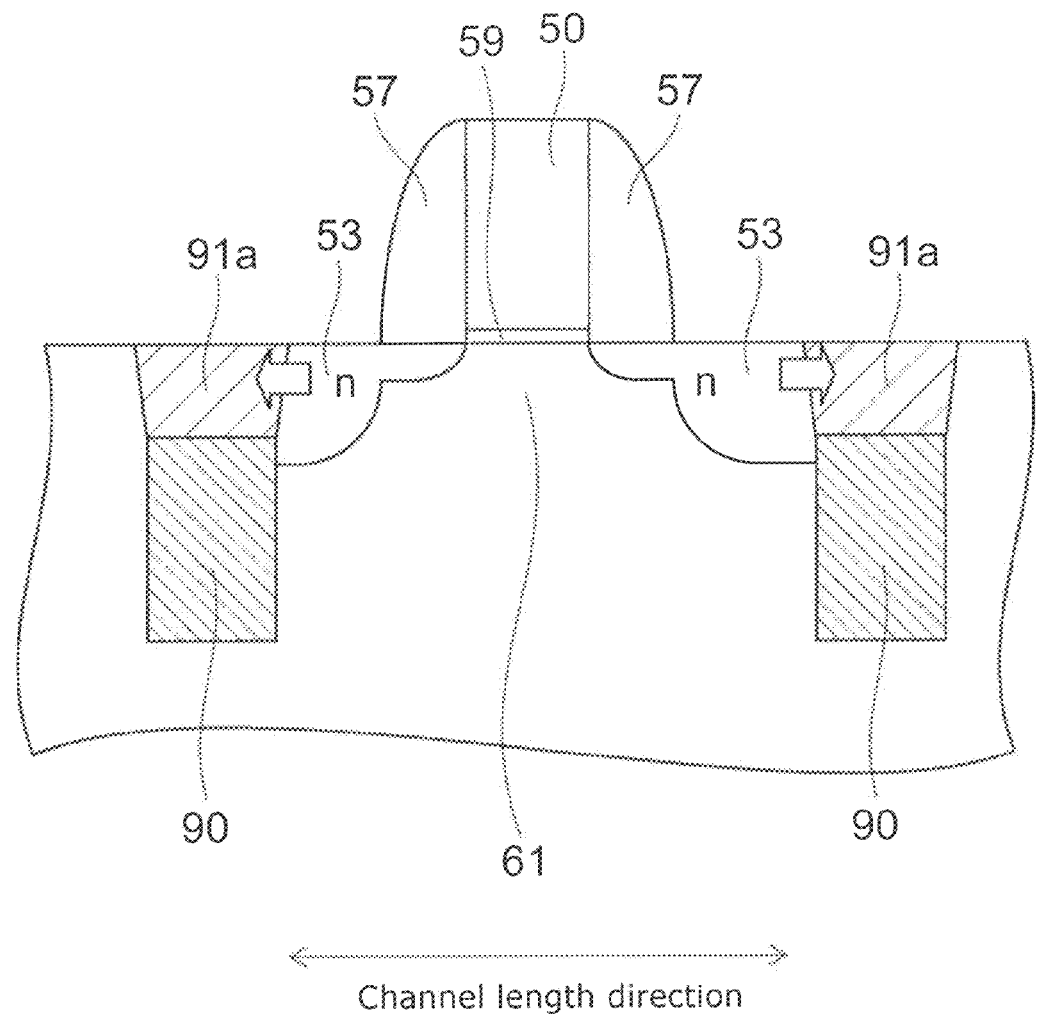
FIG. 35 is a cross-sectional view taken along line N-N in FIG. 34, and shows an nFET.

FIG. 35 is a cross-sectional view taken along line N-N in FIG. 34, and shows an nFET.

Figure 36:
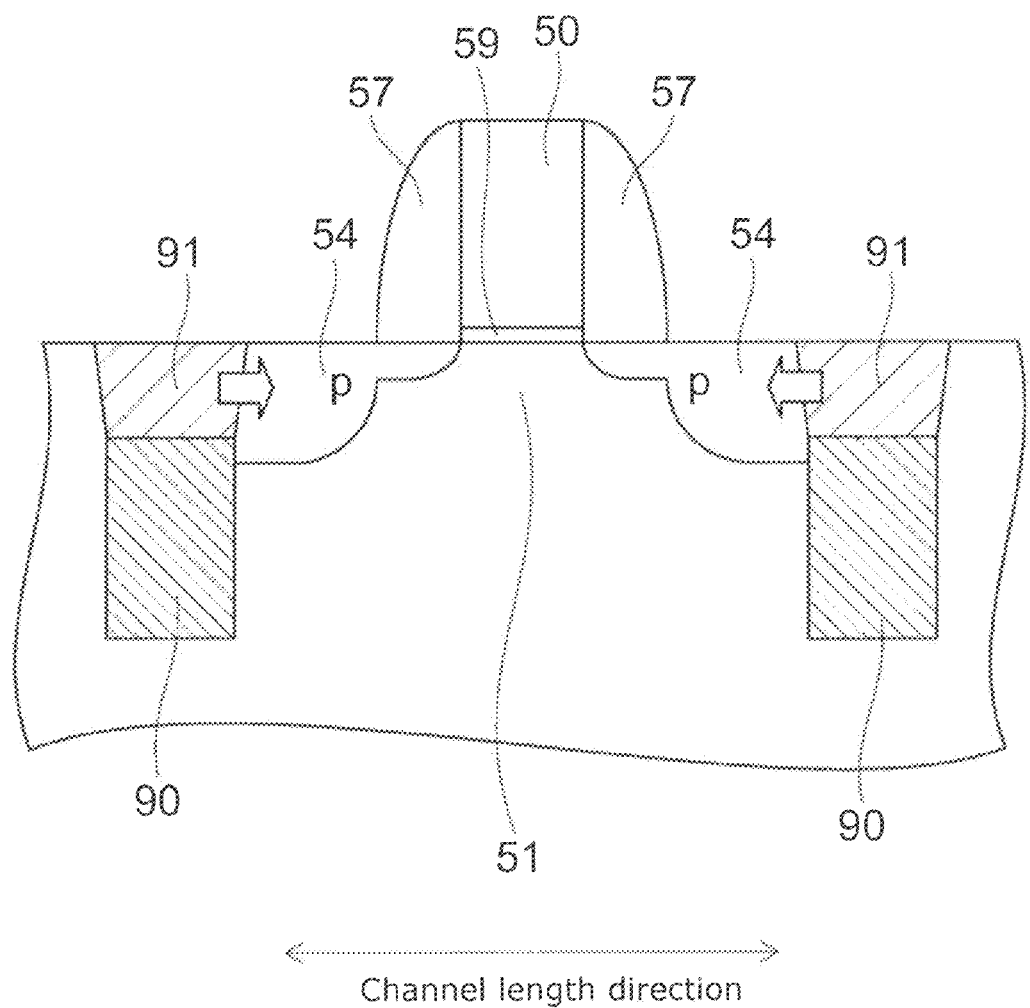
FIG. 36 is a cross-sectional view taken along line O-O in FIG. 34, and shows a pFET.

FIG. 36 is a cross-sectional view taken along line O-O in FIG. 34, and shows a pFET.

In the semiconductor device according to the present embodiment, as in the aforementioned seventh embodiment, ultraviolet light irradiation is selectively performed on an element isolation insulating layer, so that, in the element isolation insulating layer, portions 91 in contact with both ends, in the channel length direction, of a p-channel semiconductor active region 51 remain to have a compression stress, and the other portions 91a are made to have a tensile stress.

In the present embodiment, the element isolation insulating layer has a layered structure including layers made of different materials in consideration of the filling quality of a trench with the element isolation insulating layer.

As shown in FIGS. 35 and 36, a trench having a depth of several hundreds nm is firstly filled with an element isolation insulating layer 90 made of a material having a relatively good filling property, such as silicon oxide, up to the depth of approximately 60 nm. Then, the trench having the remaining depth of approximately 60 nm is filled with an element isolation insulating layer 91 made of a material likely to provide a relatively large stress, such as silicon nitride. In an initial condition before being irradiated with ultraviolet light, the element isolation insulating layer 90 has substantially no stress while the element isolation insulating layer 91 has a compression stress.

Then, as in the fifth embodiment, the element isolation insulating layer 91 is irradiated with ultraviolet light, with only the portions outside the both ends, in the channel length direction, of the p-channel semiconductor active region 51 covered with a mask.

Thus, the portions covered with the mask are not irradiated with ultraviolet light, thus remaining in an initial condition, i.e., remaining to have a compression stress. The other portions are irradiated with ultraviolet light, and thus changed in quality to become to the element isolation insulating layer 91a having an isotropic tensile stress from the initial condition. The lower element separation insulation layer 90 is not irradiate with ultraviolet light, and thus remains to have substantially no stress.

The element isolation insulating layers 91a made to have a tensile stress surround portions (source/drain regions, channels) substantially contributing to current conduction, of a surface layer in the semiconductor layer, and can apply a tensile stress to the channels. Likewise, the element isolation insulating layers 91 having a compression stress surround portions (source/drain regions, a channel) substantially contributing to current conduction, of the surface layer in the semiconductor layer, and can apply a tensile stress to the channel.

The p-channel semiconductor active region 51 is surrounded by: the element isolation insulating layers 91, which cover both ends, in the channel length direction, of the p-channel semiconductor active region 51; and the element isolation insulating layers 91a, which cover the side surfaces, approximately parallel to the channel length direction, of the p-channel semiconductor active region 51. The element isolation insulating layers 91a have a tensile stress, and can thus apply a tensile stress to the channel of the p-channel semiconductor active region 51 in the channel width direction, thereby increasing the career mobility in the pFET. The element isolation insulating layers 91 have a compression stress, and thus apply a compression stress to the channel of the p-channel semiconductor active region 51 in the channel length direction, thereby further increasing the career mobility in the pFET.

In the n-channel semiconductor active region 61, which is surrounded by only the element isolation insulating layer 91a, a tensile stress takes effect in both the channel length and width directions. Accordingly, the career mobility can be improved in the nFET. Moreover, the n-channel semiconductor active region 61 is not in contact with the element isolation insulating layer 91, the compression stress of the element isolation insulating layer 91 is not applied to the channel of the n-channel semiconductor active region 61.

As described above, according to the present embodiment as well, a stress appropriate for a pFET is applied to a pFET while a stress appropriate for an nFET is applied to an nFET, in a semiconductor device in which a pFET and an nFET are formed on a single semiconductor substrate (in a single chip). This improves the career mobility in both of the transistors, thus increasing the performance of the entire semiconductor device.

In the above described fifth to eighth embodiments, ultraviolet light irradiation is selectively performed on the element isolation insulating layer, so that, in the element isolation insulating layer, portions in contact with both ends, in the channel length direction, of the p-channel semiconductor active region 51 remain to have either substantially no stress or a compression stress, and the other portions are made to have a tensile stress. However, instead, an element isolation insulating layer having an isotropic tensile stress in an initial condition before being irradiated with ultraviolet light may be used. In this case, in the element isolation insulating layer, only portions in contact with both ends, in the channel length direction, of the p-channel semiconductor active region 51 are irradiated with ultraviolet light to have either substantially no stress or a compression stress.

In the fifth to eighth embodiments as well as in the aforementioned first to third embodiments, a first stress liner having an isotropic compression stress may be provided to cover the pFET, while a second stress liner having an isotropic tensile stress may be provided to cover the nFET so that the stress liners can apply the stresses to the channel, thereby further improving the career mobility in both of the transistors.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
a p-channel semiconductor active region having a p-type source region and a p-type drain region;
an n-channel semiconductor active region having an n-type source region and an n-type drain region;
an element isolation insulating layer which electrically isolates the p-channel semiconductor active region from the n-channel semiconductor active region; and
an insulating layer made of a material different from that of the element isolation insulating layer, and being in contact with both ends, in its channel length direction, of the p-channel semiconductor active region to apply a compression stress in the channel length direction to a channel of the p-channel semiconductor active region, wherein,
the p-channel semiconductor active region is surrounded by the insulating layer, which is in contact with the both ends, in the channel length direction, of the p-channel semiconductor active region, and the p-channel semiconductor active region is surrounded by the element isolation insulating layer, which is in contact with side surfaces, approximately parallel to the channel length direction, of the p-channel semiconductor active region, and
the n-channel semiconductor active region is surrounded by the element isolation insulating layer.

2. The semiconductor device according to claim 1, wherein a width of the insulating layer in a channel width direction approximately perpendicular to the channel length direction is larger than the width in the channel width direction of the p-channel semiconductor active region.

3. The semiconductor device according to claim 1, wherein the element isolation insulating layer has an isotropic tensile stress.

4. The semiconductor device according to claim 1, wherein the insulating layer has smaller thermal expansion efficiency than the element isolation insulating layer.

5. The semiconductor device according to claim 1, wherein the insulating layer is provided on a top surface of the element isolation insulating layer.

6. The semiconductor device according to claim 5, wherein a bottom edge of the insulating layer is provided in a lower position than a bottom edge of the p-type source region and the p-type drain region.

7. The semiconductor device according to claim 5, wherein a bottom edge of the insulating layer is provided in a higher position than a bottom edge of the p-type source region and the p-type drain region.

8. The semiconductor device according to claim 1, wherein,
the element isolation insulating layer is a STI structure, and
the insulating layer is embedded in the STI structure and on the element isolation insulating layer.

9. The semiconductor device according to claim 8, wherein the insulating layer is provided on a top surface of element isolation insulating layer in the STI structure.

10. The semiconductor device according to claim 8, wherein a top surface of the element isolation insulating layer and a top surface of the insulating layer are provided in substantially a same vertical position.

11. A semiconductor device, comprising:
a p-channel semiconductor active region having a p-type source region and a p-type drain region;
an n-channel semiconductor active region having an n-type source region and an n-type drain region;
an element isolation insulating layer which surrounds the p-channel semiconductor active region and the n-channel semiconductor active region so as to electrically isolate the p-channel semiconductor active region from the n-channel semiconductor active region,
wherein a portion, surrounding the n-channel semiconductor active region, of the element isolation insulating layer has an isotropic tensile stress, while
different portions of the element isolation insulating layer have either substantially no stress or a compression stress, the different portions being in contact with both ends, in the channel length direction, of the p-channel semiconductor active region,
due to ultraviolet light irradiation selectively performed on the element isolation insulating layer.

* * * * *